United States Patent
Tsutsumi et al.

(10) Patent No.: US 9,160,055 B2
(45) Date of Patent: Oct. 13, 2015

(54) WIRELESS DEVICE

(71) Applicant: KABUSHIKI KAISHA TOSHIBA, Minato-ku, Tokyo (JP)

(72) Inventors: Yukako Tsutsumi, Kawasaki (JP); Koh Hashimoto, Yokohama (JP); Takayoshi Ito, Yokohama (JP); Koji Akita, Yokohama (JP); Koji Ogura, Tachikawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 44 days.

(21) Appl. No.: 13/782,552

(22) Filed: Mar. 1, 2013

(65) Prior Publication Data
US 2014/0158774 A1    Jun. 12, 2014

(30) Foreign Application Priority Data
Dec. 12, 2012    (JP) .................. 2012-271402

(51) Int. Cl.
*G06K 19/06* (2006.01)
*H01Q 1/22* (2006.01)
(Continued)

(52) U.S. Cl.
CPC ........... *H01Q 1/2266* (2013.01); *H01Q 1/2283* (2013.01); *H01Q 1/40* (2013.01); *G06K 19/07773* (2013.01)

(58) Field of Classification Search
CPC ........... H01L 2224/48227; H01L 2224/73265; H01L 2924/14; G06K 19/077; G06K 19/07732; G06K 19/07794; H01Q 21/0087; H01Q 23/00; H01Q 21/0025; H01Q 9/0407; H01Q 13/10; H01Q 1/2225; H01Q 1/2283; H01Q 1/3233; H01Q 7/00; H01Q 9/265

USPC .......... 235/492, 487, 488; 343/777, 778, 767, 343/700 MS

See application file for complete search history.

(56) References Cited

U.S. PATENT DOCUMENTS

| | | | |
|---|---|---|---|
| 2,283,914 A | | 5/1942 | Carter |
| 5,276,455 A | * | 1/1994 | Fitzsimmons et al. ........ 343/777 |

(Continued)

FOREIGN PATENT DOCUMENTS

| | | |
|---|---|---|
| JP | 5-327329 A | 12/1993 |
| JP | 8-088581 A | 4/1996 |

(Continued)

OTHER PUBLICATIONS

U.S. Appl. No. 13/178,967; First Named Inventor: Yukako Tsutsumi; Title: "Radio Device"; filed Jul. 8, 2011.
(Continued)

*Primary Examiner* — Thien M Le
(74) *Attorney, Agent, or Firm* — Holtz, Holtz, Goodman & Chick PC

(57) ABSTRACT

According to one embodiment, a wireless device is provided with a semiconductor chip, a substrate, an antenna, and a sealing material. The chip includes a wireless circuit. The substrate has a plurality of terminals arranged on a first surface and the chip arranged on a second surface. The antenna includes a radiation element and is electrically connected to the chip. The sealing material seals the chip and the antenna. A distance between a first wall of the sealing material substantially parallel to the second surface and the radiation element is equal to or more than a distance between a second wall of the sealing material substantially perpendicular to the second surface and the radiation element.

19 Claims, 23 Drawing Sheets

(51) Int. Cl.
*H01Q 1/40* (2006.01)
*G06K 19/077* (2006.01)

(56) References Cited

U.S. PATENT DOCUMENTS

| | | | |
|---|---|---|---|
| 5,422,650 A | 6/1995 | Hill | |
| 5,488,380 A * | 1/1996 | Harvey et al. | 342/368 |
| 5,682,143 A | 10/1997 | Brady et al. | |
| 5,786,626 A | 7/1998 | Brady et al. | |
| 5,972,156 A | 10/1999 | Brady et al. | |
| 6,078,259 A | 6/2000 | Brady et al. | |
| 6,137,453 A | 10/2000 | Wang et al. | |
| 6,249,242 B1 * | 6/2001 | Sekine et al. | 342/70 |
| 6,271,793 B1 | 8/2001 | Brady et al. | |
| 6,662,430 B2 | 12/2003 | Brady et al. | |
| 6,717,544 B2 | 4/2004 | Nagasaku et al. | |
| 6,770,955 B1 | 8/2004 | Coccioli et al. | |
| 6,833,806 B2 | 12/2004 | Nagasaku et al. | |
| 6,906,677 B2 | 6/2005 | Yamamoto et al. | |
| 7,154,432 B2 | 12/2006 | Nagasaku et al. | |
| 7,295,161 B2 | 11/2007 | Gaucher et al. | |
| 7,329,950 B2 | 2/2008 | Khorram | |
| 7,382,331 B2 | 6/2008 | Kurashima et al. | |
| 7,518,221 B2 | 4/2009 | Gaucher et al. | |
| 7,545,329 B2 | 6/2009 | Gaucher et al. | |
| 7,559,131 B2 | 7/2009 | Credelle et al. | |
| 7,580,001 B2 | 8/2009 | Tsai et al. | |
| 7,586,193 B2 | 9/2009 | Weste | |
| 7,619,529 B2 | 11/2009 | Goff et al. | |
| 7,768,456 B2 | 8/2010 | Tsutsumi et al. | |
| 7,782,624 B2 | 8/2010 | Fujii | |
| 7,971,791 B2 * | 7/2011 | Nishizawa et al. | 235/492 |
| 8,123,131 B2 | 2/2012 | Sawachi | |
| 8,330,259 B2 | 12/2012 | Soler Castany et al. | |
| 2005/0169544 A1 * | 8/2005 | Clark | 382/236 |
| 2006/0033664 A1 | 2/2006 | Soler Castany et al. | |
| 2006/0151614 A1 * | 7/2006 | Nishizawa et al. | 235/492 |
| 2006/0256018 A1 | 11/2006 | Soler Castany et al. | |
| 2007/0120742 A1 | 5/2007 | Soler Castany et al. | |
| 2007/0194427 A1 | 8/2007 | Choi et al. | |
| 2007/0200708 A1 | 8/2007 | Hayama et al. | |
| 2007/0273600 A1 | 11/2007 | Tsujimura et al. | |
| 2008/0158091 A1 | 7/2008 | Imaoka et al. | |
| 2008/0158094 A1 | 7/2008 | Rofougaran | |
| 2009/0085810 A1 | 4/2009 | Soler Castany et al. | |
| 2011/0309893 A1 | 12/2011 | Kawamura et al. | |
| 2012/0075147 A1 | 3/2012 | Tsutsumi et al. | |
| 2012/0193810 A1 | 8/2012 | Tsutsumi et al. | |
| 2012/0249380 A1 | 10/2012 | Soler Castany et al. | |
| 2012/0319913 A1 | 12/2012 | Tsutsumi et al. | |
| 2013/0016015 A1 | 1/2013 | Tsutsumi | |
| 2013/0016029 A1 | 1/2013 | Tsutsumi | |

FOREIGN PATENT DOCUMENTS

| | | | |
|---|---|---|---|
| JP | 8-213419 | A | 8/1996 |
| JP | 10-013296 | A | 1/1998 |
| JP | 11-261456 | A | 9/1999 |
| JP | 2000-174543 | A | 6/2000 |
| JP | 2001-196824 | A | 7/2001 |
| JP | 2001-203519 | A | 7/2001 |
| JP | 2001196829 | A | 7/2001 |
| JP | 2005-228226 | A | 8/2005 |
| JP | 2006-505973 | A | 2/2006 |
| JP | 2007-267217 | A | 10/2007 |
| JP | 2007-300266 | A | 11/2007 |
| JP | 2007-312354 | A | 11/2007 |
| JP | 2008-028691 | A | 2/2008 |
| JP | 2008-035033 | A | 2/2008 |
| JP | 2008-141215 | A | 6/2008 |
| JP | 2008131215 | A | 6/2008 |
| JP | 2008-167036 | A | 7/2008 |
| JP | 4121860 | B2 | 7/2008 |
| JP | 2008160949 | A | 7/2008 |
| JP | 2008-259250 | A | 10/2008 |
| JP | 2010-021456 | A | 1/2010 |
| JP | 2010-109466 | A | 5/2010 |
| JP | 2010-183055 | A | 8/2010 |
| JP | 4523223 | B2 | 8/2010 |
| JP | 2011-130254 | A | 6/2011 |
| JP | 2012070253 | A | 4/2012 |
| WO | WO 96/13793 | A1 | 5/1996 |
| WO | WO 2004/042868 | A1 | 5/2004 |

OTHER PUBLICATIONS

U.S. Appl. No. 13/344,848; First Named Inventor: Yukako Tsutsumi; Title: "Wireless Apparatus and Wireless System"; filed Jan. 6, 2012.
U.S. Appl. No. 13/477,464; First Named Inventor: Yukako Tsutsumi; Title: "Wireless Apparatus"; filed May 22, 2012.
U.S. Appl. No. 13/447,676; First Named Inventor: Yukako Tsutsumi; Title: "Wireless Apparatus"; filed Apr. 16, 2012.
U.S. Appl. No. 13/542,149; First Named Inventor: Yukako Tsutsumi; Title: "Antenna Device and Wireless Apparatus"; filed Jul. 5, 2012.
"Japanese Office Action dated Mar. 4, 2014 in counterpart Japanese Application No. 2012-271402".

* cited by examiner

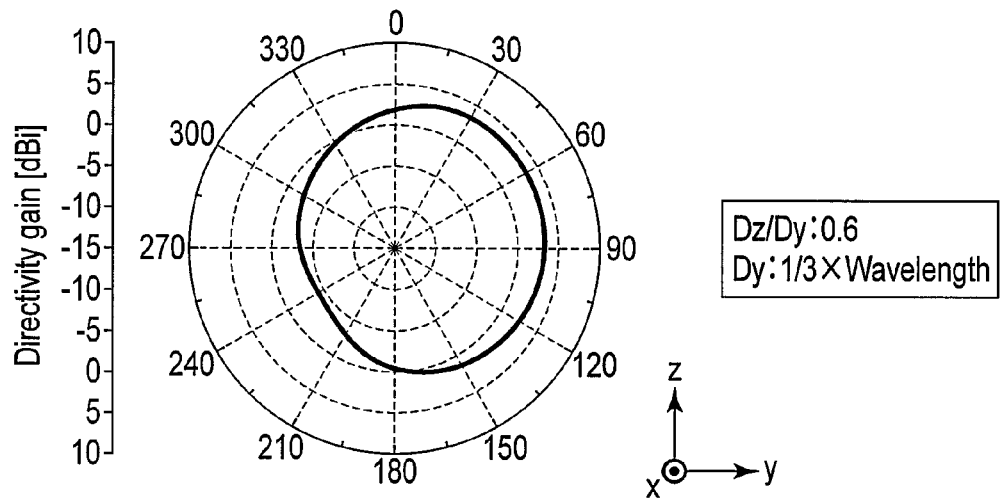
F I G. 7
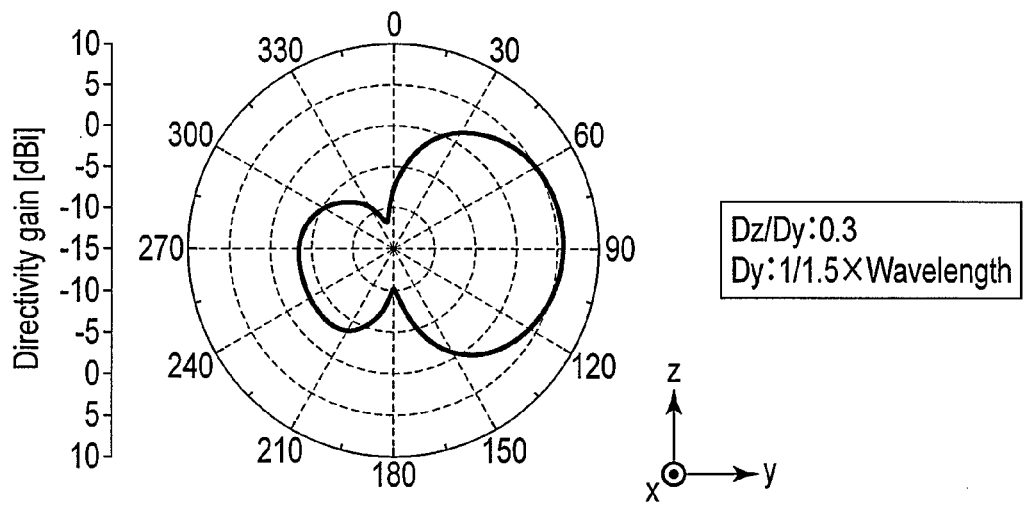
F I G. 8

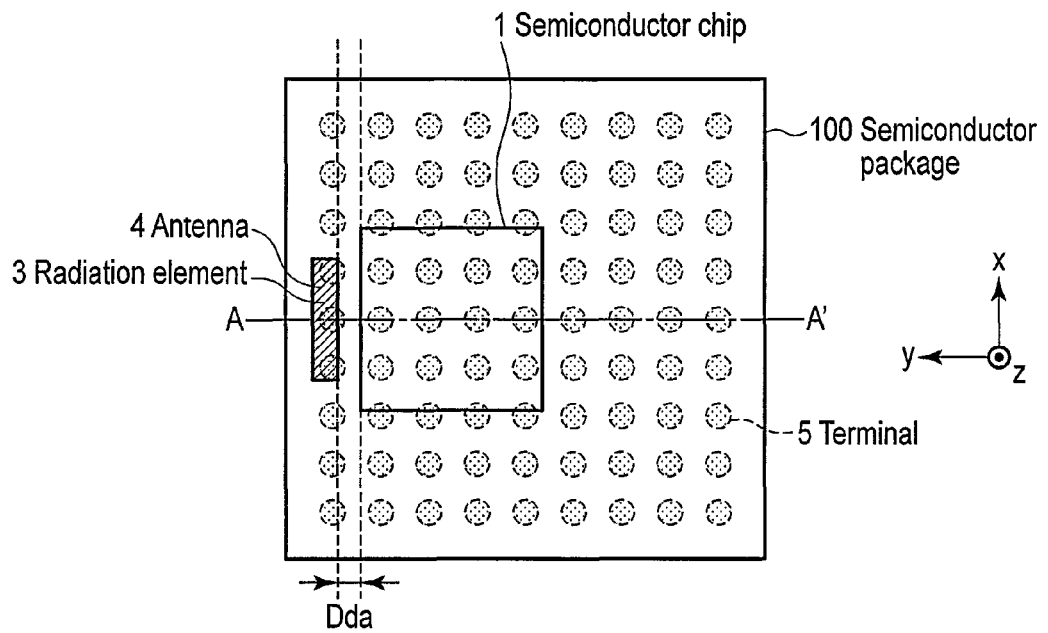
F I G. 12
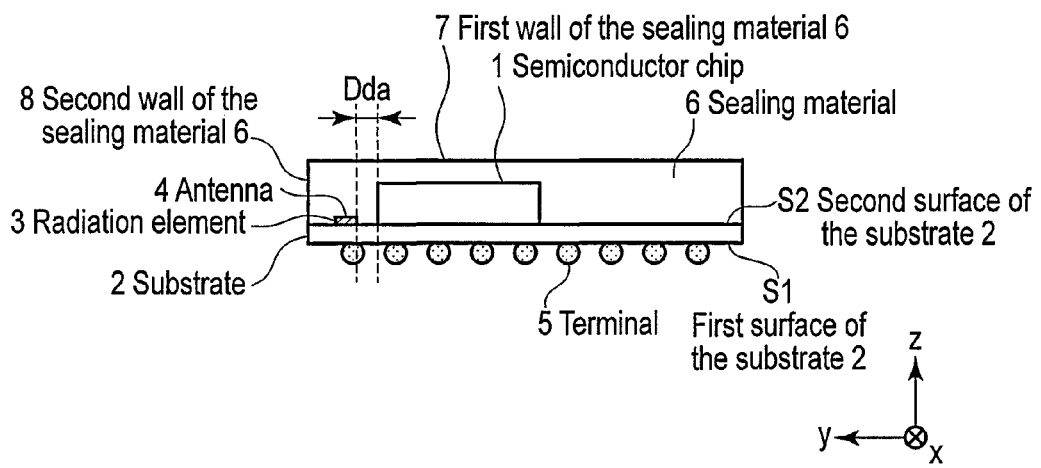
F I G. 13

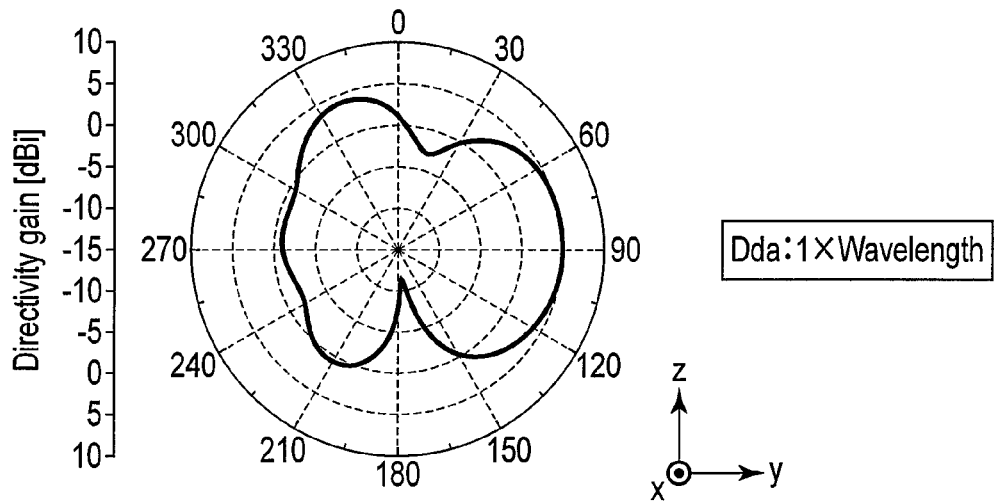
F I G. 20
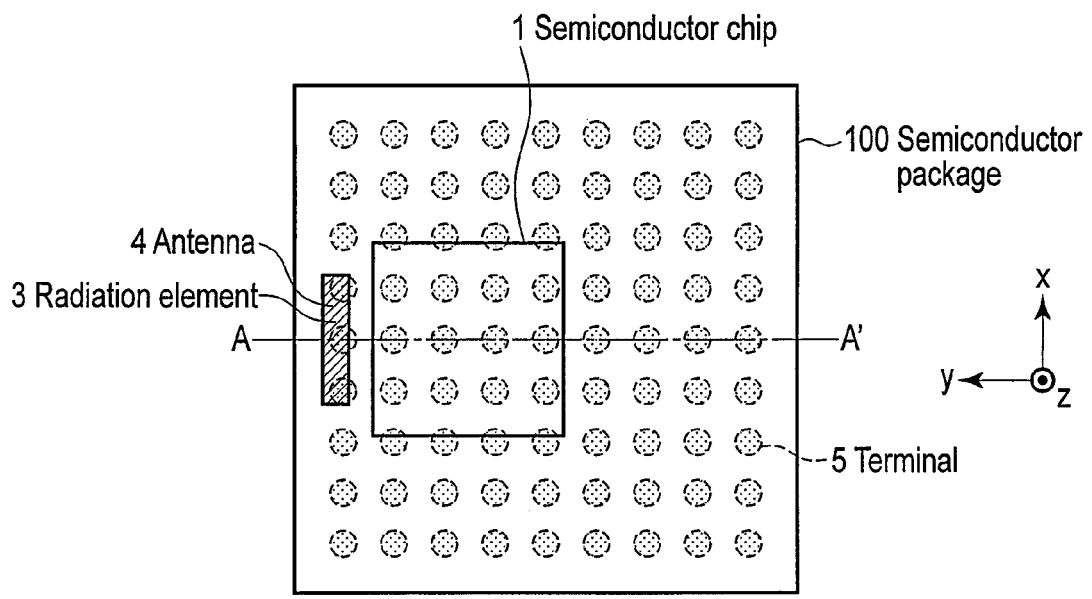
F I G. 21

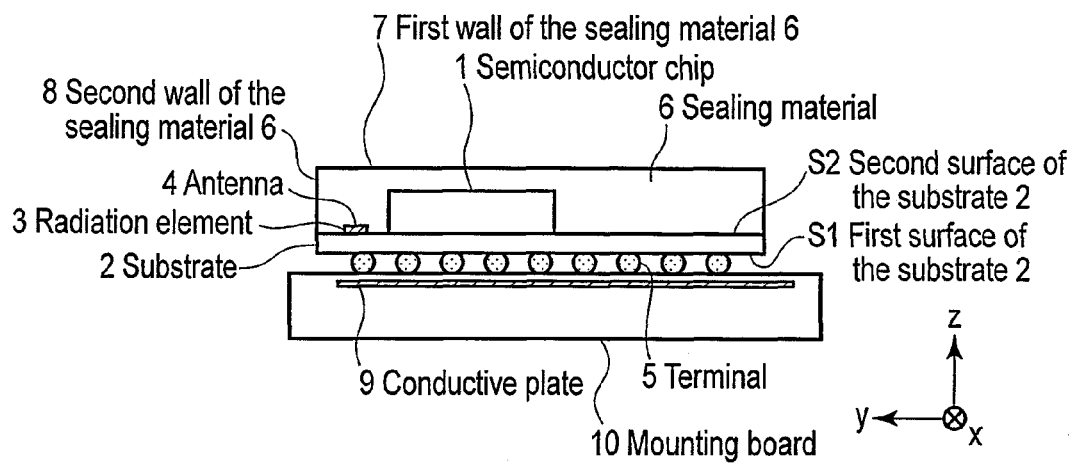
F I G. 28
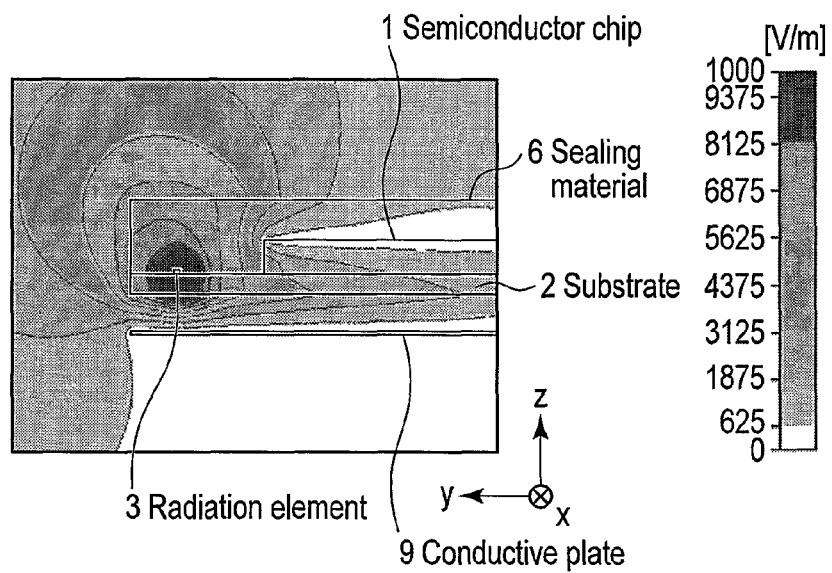
F I G. 29

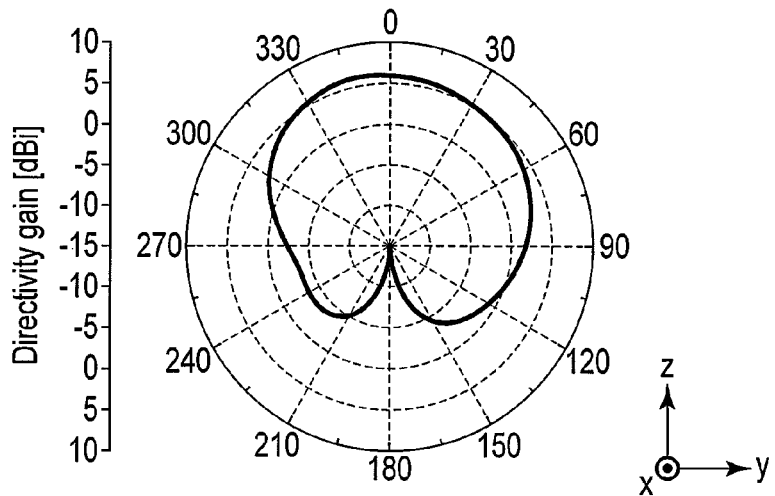
F I G. 30
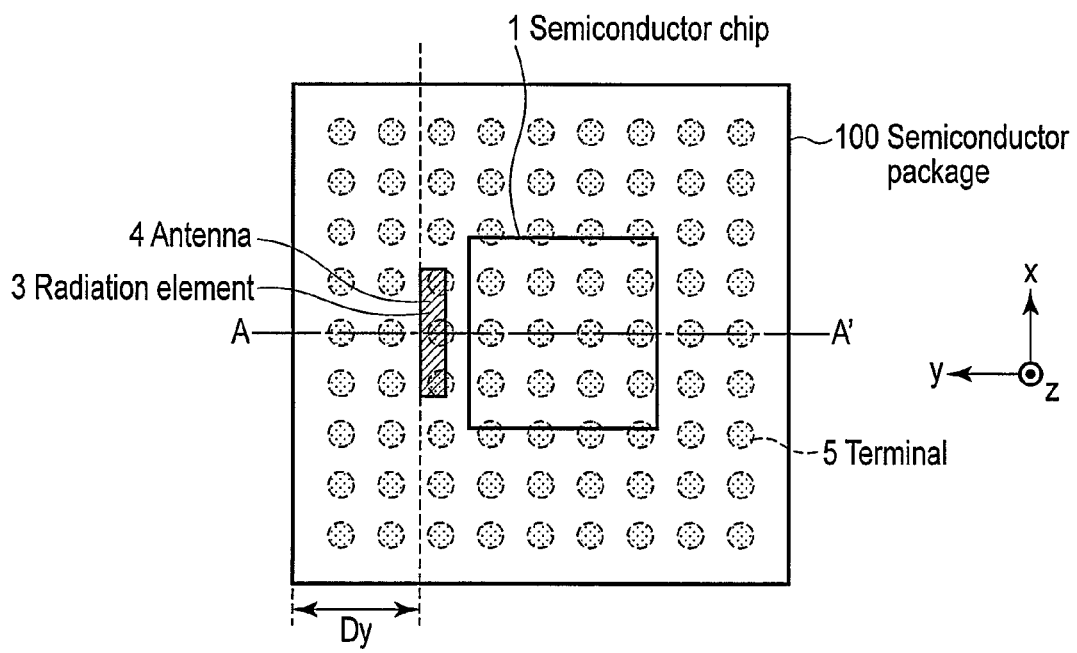
F I G. 31

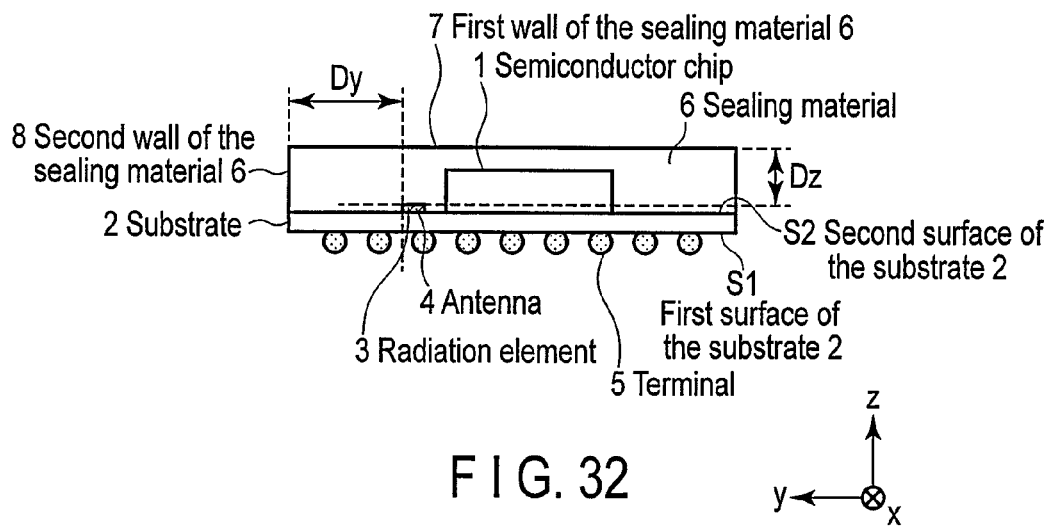
F I G. 32
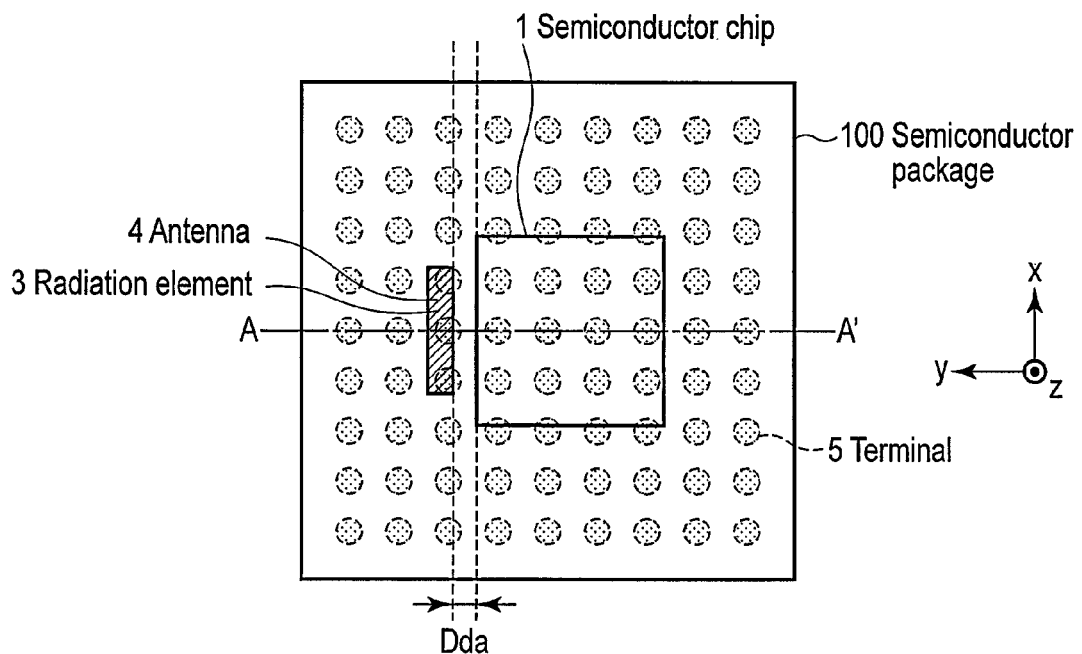
F I G. 33

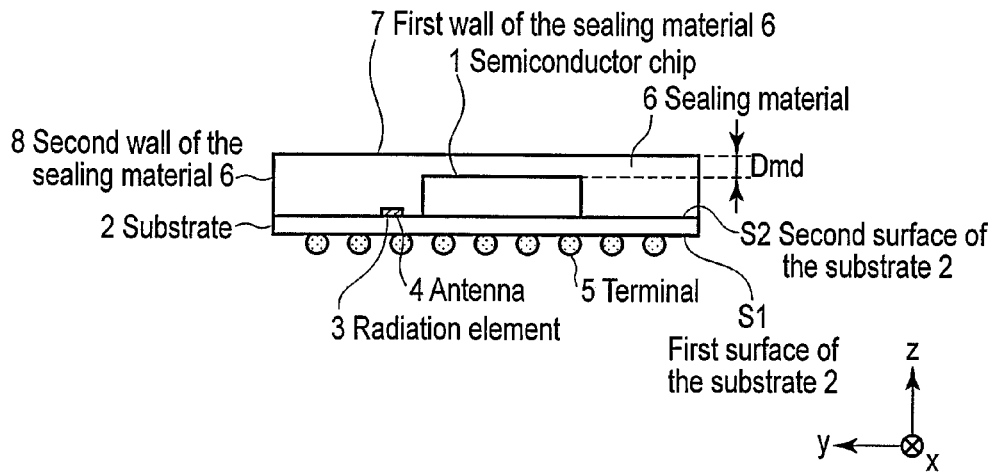
F I G. 37
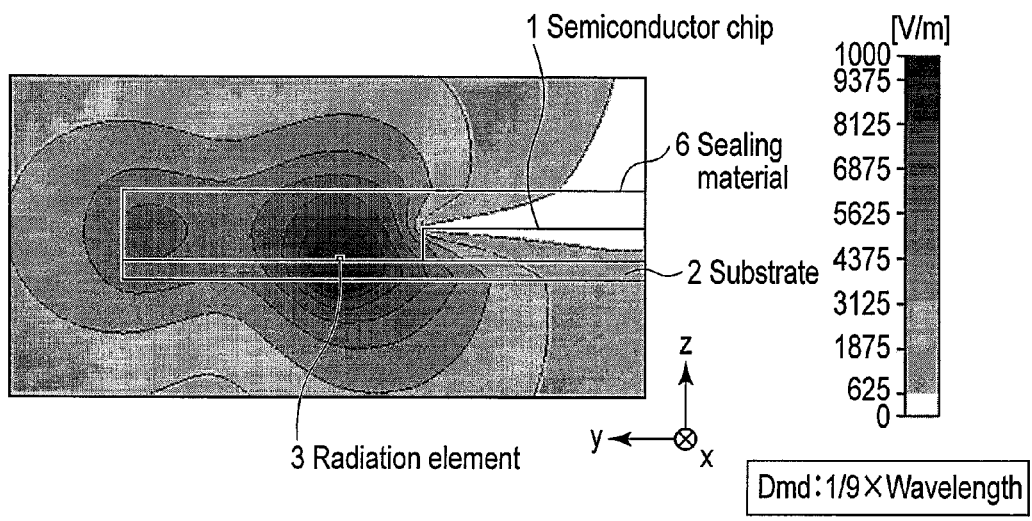
F I G. 38

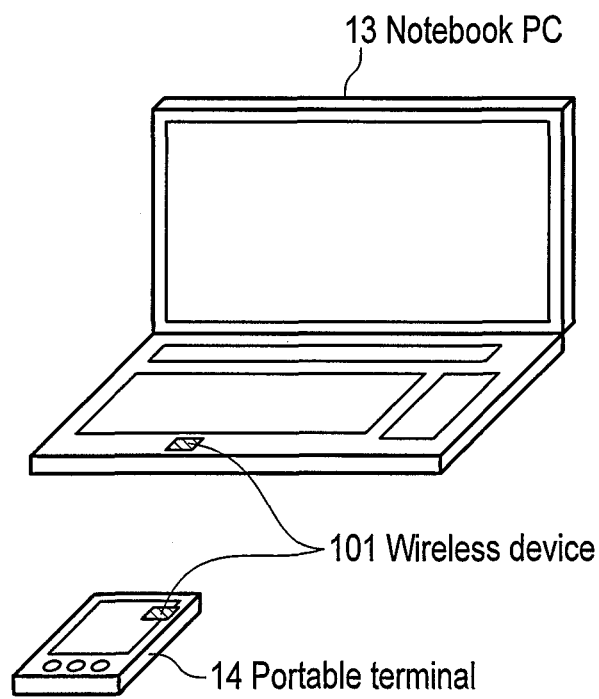
F I G. 45
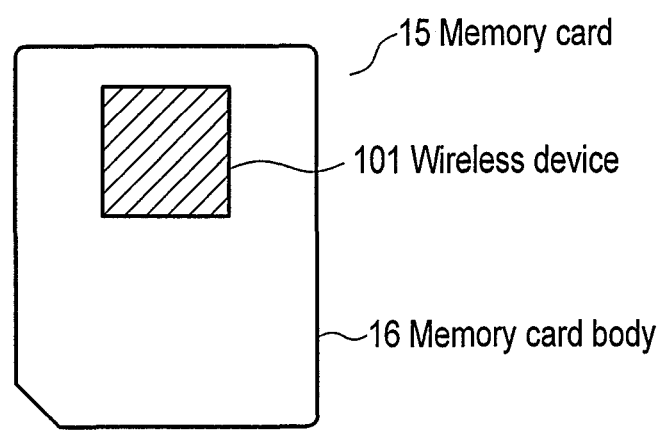
F I G. 46

WIRELESS DEVICE

CROSS-REFERENCE TO RELATED APPLICATIONS

This application is based upon and claims the benefit of priority from Japanese Patent Application No. 2012-271402, filed Dec. 12, 2012, the entire contents of which are incorporated herein by reference.

FIELD

Embodiments described herein relate to a wireless device.

BACKGROUND

A radar sensor with an antenna using a signal of a millimeter or submillimeter wave of 20 GHz or more is known. Radar sensors appropriate for miniaturization or lower costs have been proposed. In such a radar sensor, active circuits such as an oscillator and mixer and an antenna constituting the radar sensor are formed on the same semiconductor substrate and configured as one-chip MMIC (Monolithic Microwave Integrated Circuit). Further, the MMIC is sealed in a resin package. In this radar sensor, an electromagnetic wave is radiated in a desired direction by a dielectric lens mounted on an upper portion of the antenna.

It is necessary to form a dielectric lens on the resin package to radiate an electromagnetic wave in a desired direction and thus, the package has a protruding structure, leading to a thicker package as a whole. It is also necessary to optimize the position and/or shape of the lens in accordance with the position and/or shape of the antenna, creating a problem of low versatility of the package.

BRIEF DESCRIPTION OF THE DRAWINGS

FIGS. 6-8 show electromagnetic field simulation results of a radiation directivity pattern;

FIG. 12 is a top view showing the outline configuration of a wireless device according to a third embodiment;

FIG. 13 is a sectional view along line A-A' in FIG. 12;

FIGS. 18-20 show electromagnetic field simulation results of the radiation directivity pattern;

FIG. 21 is a top view showing the outline configuration of a wireless device according to a fourth embodiment;

FIG. 28 is a sectional view along line A-A' in FIG. 27;

FIG. 29 shows an electromagnetic field simulation result of the distribution of the electric field intensity;

FIG. 30 shows an electromagnetic field simulation result of the radiation directivity pattern;

FIG. 31 is a top view showing the outline configuration of a wireless device according to a sixth embodiment;

FIG. 32 is a sectional view along line A-A' in FIG. 31;

FIG. 33 is a top view showing the outline configuration of a wireless device according to a seventh embodiment;

FIG. 37 is a sectional view along line A-A' in FIG. 36;

FIGS. 38-39 show electromagnetic field simulation results of the distribution of the electric field intensity;

FIG. 45 is an exemplary block diagram of the wireless apparatus on which a wireless device is mounted; and FIG. 46 is an exemplary block diagram of a memory card on which a wireless device is mounted.

DETAILED DESCRIPTION

Wireless devices according to the embodiments of the present invention will be described with reference to the drawings. In the embodiments below, portions denoted with the same numbers are considered to perform the same operations, and repeated explanation thereabout is omitted.

According to one embodiment, a wireless device is provided with a semiconductor chip, a substrate, an antenna, and a sealing material. A semiconductor chip includes a wireless circuit. A substrate has a plurality of terminals arranged on a first surface thereof and the semiconductor chip arranged on a second surface thereof that is different from the first surface. An antenna includes a radiation element and electrically connected to the semiconductor chip. A sealing material seals the semiconductor chip and the antenna. A distance between a first wall of the sealing material substantially parallel to the second surface of the substrate and the radiation element is equal to or more than a distance between a second wall of the sealing material substantially perpendicular to the second surface of the substrate and the radiation element.

According to the present embodiment, radiation directivity of an antenna can easily be oriented in a direction perpendicular to the package surface.

According to another embodiment, a wireless device is provided with a semiconductor chip, a substrate, an antenna, and a sealing material. A semiconductor chip includes a wireless circuit. A substrate has a plurality of terminals arranged on a first surface thereof and the semiconductor chip arranged on a second surface thereof that is different from the first surface. An antenna includes a radiation element and electrically connected to the semiconductor chip. A sealing material seals the semiconductor chip and the antenna. A distance between a second wall of the sealing material substantially perpendicular to the second surface of the substrate and the radiation element is more than a distance between a first wall of the sealing material substantially parallel to the second surface of the substrate and the radiation element and the distance between the second wall of the sealing material substantially perpendicular to the second surface of the substrate and the radiation element is equal to or more than approximately half a wavelength at an operating frequency.

According to the present embodiment, radiation directivity of an antenna can easily be oriented in a direction parallel to the package surface.

(1) The first to fifth embodiments below relate to a wireless device capable of orienting radiation directivity of an antenna in a direction perpendicular to the package surface.

First Embodiment

Figure 1:
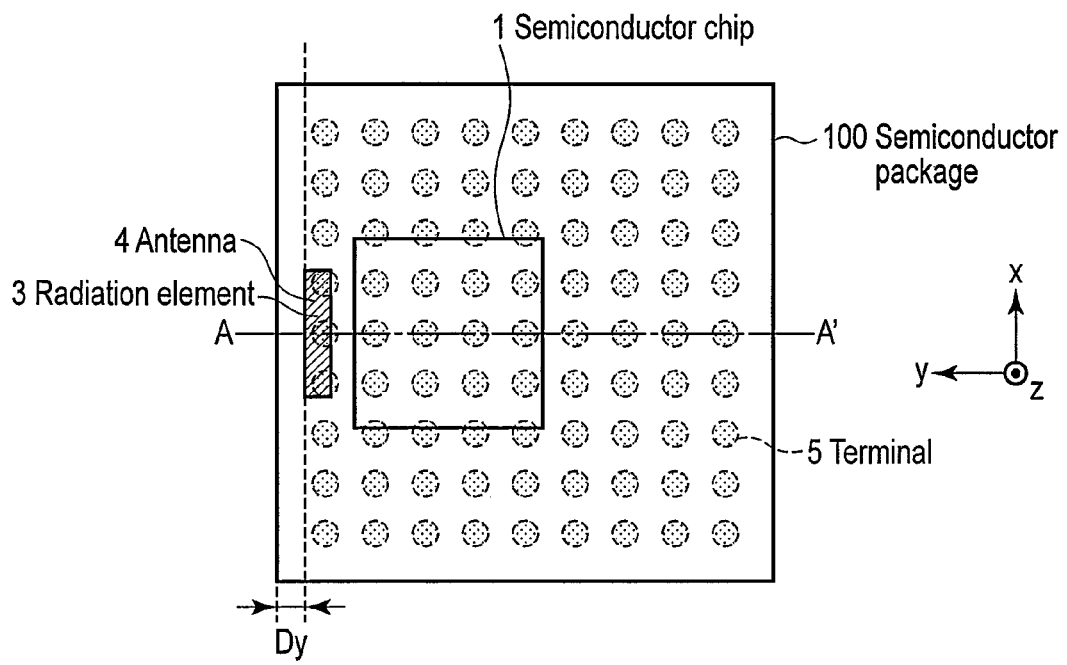
FIG. 1 is a top view showing an outline configuration of a wireless device according to a first embodiment.
Figure 2:
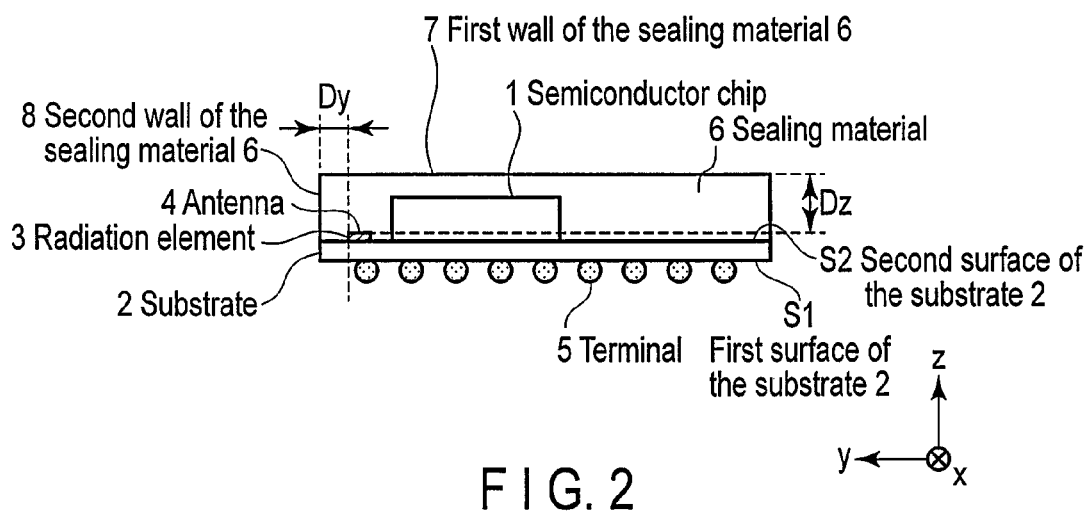
FIG. 2 is a sectional view along line A-A' in FIG. 1.

FIGS. 1 and 2 are diagrams showing an outline configuration of a wireless device according to a first embodiment. FIG. 1 is a top view and FIG. 2 is a sectional view along line A-A' in FIG. 1.

As shown in FIGS. 1 and 2, a wireless device according to the present embodiment includes a semiconductor chip 1 containing a wireless circuit, a substrate 2, and an antenna 4 containing a radiation element 3 electrically connected to the semiconductor chip 1. Here, a case when the wireless device is configured by a semiconductor package 100 including these elements 1 to 4 is taken as an example to describe the embodiments.

A plurality of terminals 5 is arranged on a first surface S1 of the substrate 2 and the semiconductor chip 1 is arranged on a second surface S2, which is different from the first surface S1, of the substrate 2. The semiconductor chip 1 and the radiation element 3 are sealed by a sealing material 6. The radiation element 3 may be embedded in a resist (not shown) of the substrate 2.

The semiconductor package 100 in FIGS. 1 and 2 is a BGA (Ball Grid Array) package including the terminals 5 formed from solder balls on the first surface S1 of the substrate 2.

However, the semiconductor package 100 is not limited to the BGA package and may be, for example, another kind of package. In addition, the wireless device is not limited to the package. For example, the wireless device may be a module comprising a semiconductor chip and a substrate.

Only the semiconductor chip 1 is mounted on the substrate 2 in the example of FIGS. 1 and 2, but the present embodiment is not limited to such an example. For example, in addition to the semiconductor chip 1, the substrate 2 may have components (not shown), for example, a chip capacitor or IC mounted thereon.

The semiconductor chip 1 is formed of a semiconductor substrate of, for example, silicon, silicon germanium, gallium arsenide or the like and has a metallic pattern of, for example, copper, aluminum, gold or the like formed inside or on a surface layer thereof. Incidentally, the semiconductor chip 1 may be a dielectric substrate, magnetic substrate, metal, or a combination thereof. Alternatively, the semiconductor chip 1 may be constituted of CSP (Chip Size Package). The number of the semiconductor chips 1 is one in FIGS. 1 and 2, but may be more than one and semiconductor chips may be stacked or aligned horizontally. The semiconductor chip 1 has a rectangular parallelepiped shape in FIGS. 1 and 2, but is not limited to the rectangular parallelepiped shape and may have, for example, any prism shape other than the rectangular parallelepiped shape, any cylindrical shape, or any other complex shapes.

The semiconductor chip 1 is electrically connected to a wire of the substrate 2 or the ground (not shown) through a bonding wire or bump or the like.

The radiation element 3 in FIGS. 1 and 2 is formed on the second surface S2 of the substrate 2. The radiation element 3 is electrically connected to an antenna terminal (not shown) of the semiconductor chip 1 by, for example, a bonding wire, bump, transmission line or the like. The radiation element 3 is a part or the whole of the antenna 4.

The relation between the antenna 4 and the radiation element 3 will be described. The radiation element 3 is a portion that radiates an electromagnetic wave. When the radiation element 3 is a part of the antenna 4, a portion of the antenna 4 other than the radiation element 3 is, for example, a wire to connect an element (for example, the semiconductor chip 1) outside the antenna 4 and the radiation element 3. The radiation electromagnetic field discussed below emanates from the radiation element 3 of the antenna 4. On the other hand, when the whole antenna 4 is the radiation element 3, the whole antenna 4 is involved in the generation of a radiation electromagnetic field. The relation between the antenna 4 and the radiation element 3 described here applies to each embodiment described below.

The radiation element 3 may be formed, as shown in FIGS. 1 and 2, on the substrate 2 or formed of a bonding wire or bump or the like (not shown). The radiation element 3 is, for example, a part or the whole of a dipole antenna, loop antenna, inverted F antenna, or patch antenna. The number of the radiation elements 3 is one in FIGS. 1 and 2, but the number thereof may be more than one.

The sealing material 6 in FIGS. 1 and 2 is made of, for example, a dielectric such as resin. The sealing material 6 may be formed of another dielectric, for example, ceramic. The surface of the sealing material 6 in FIGS. 1 and 2 has a simple rectangular parallelepiped shape and the sealing material 6 can easily be formed by a versatile molding.

The semiconductor package 100 in FIGS. 1 and 2 is configured so that a distance Dz between a first wall 7 of the sealing material 6 substantially parallel to the second surface S2 of the substrate 2 and the radiation element 3 is equal to or more than a distance Dy between a second wall 8 of the sealing material 6 substantially perpendicular to the second surface S2 of the substrate 2 and the radiation element 3, that is, Dz≥Dy holds. The distance Dy is, for example, the shortest distance or the average distance between the wall 8 of the sealing material 6 and the radiation element 3.

An electromagnetic field is pulled toward a higher dielectric constant. The sealing material 6 formed of a dielectric has a higher dielectric constant than the ambient air. Therefore, an electromagnetic field generated by the radiation element 3 is propagated in a direction substantially perpendicular to the second surface S2 of the substrate 2 by making the distance Dz between the first wall 7 of the sealing material 6 substantially parallel to the second surface S2 of the substrate 2 and the radiation element 3 equals to or more than the distance Dy between the second wall 8 of the sealing material 6 substantially perpendicular to the second surface S2 of the substrate 2 and the radiation element 3. As a result, radiation directivity can be oriented in a direction substantially perpendicular to the second surface S2 of the substrate 2, that is, the +z direction.

Electromagnetic field simulation results when the radiation element 3 in FIGS. 1 and 2 is used as a dipole antenna will be described with reference to FIGS. 3 to 5 and 6 to 8. The terminals 5 are omitted in the simulation.

Figure 3:
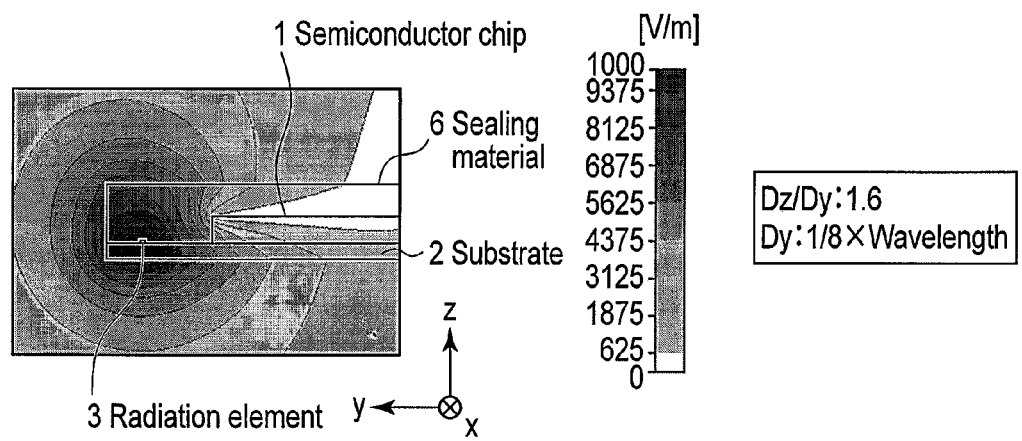
FIGS. 3-5 show electromagnetic field simulation results of the distribution of the electric field intensity.
Figure 4:
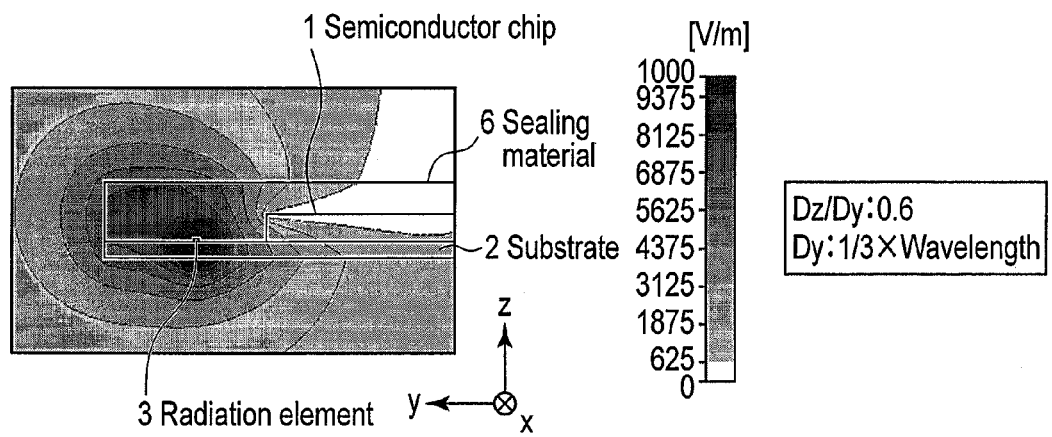
Figure 5:
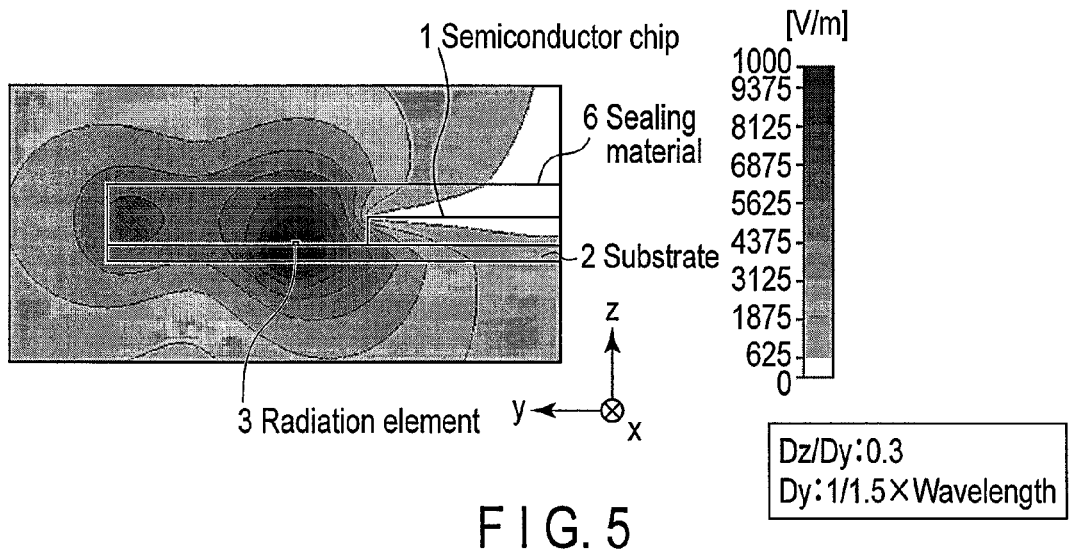

FIGS. 3 to 5 show electromagnetic field simulation results of the distribution of the electric field intensity. FIG. 3 shows a result in the case of Dz/Dy=1.6 and Dy=approximately ⅛ wavelength at the operating frequency, FIG. 4 shows a result in the case of Dz/Dy=0.6 and Dy=approximately ⅓ wavelength at the operating frequency, and FIG. 5 shows a result in the case of Dz/Dy=0.3 and Dy=approximately 1/1.5 wavelength at the operating frequency.

Figure 6:
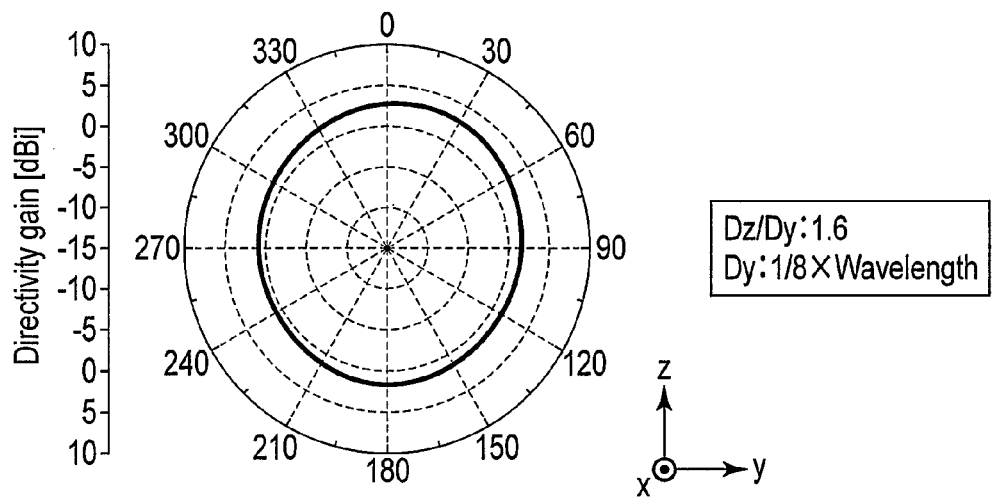

FIGS. 6 to 8 show electromagnetic field simulation results of a radiation directivity pattern. FIG. 6 shows a result in the case of Dz/Dy=1.6 and Dy=approximately ⅛ wavelength at the operating frequency, FIG. 7 shows a result in the case of Dz/Dy=0.6 and Dy=approximately ⅓ wavelength at the operating frequency, and FIG. 8 shows a result in the case of Dz/Dy=0.3 and Dy=approximately 1/1.5 wavelength at the operating frequency.

FIGS. 3 to 5 and FIGS. 6 to 8 show characteristics in the cross section of the yz plane shown in FIG. 2.

Referring to FIGS. 3 to 5 and FIGS. 6 to 8 shows that the electric field is pulled in the +z direction and the radiation directivity is oriented in the +z direction with an increasing ratio Dz/Dy of Dz and Dy and, on the other hand, the electric field is pulled in the +y direction and the radiation directivity is oriented in the +y direction with a decreasing ratio Dz/Dy.

Thus, an electromagnetic field generated by the radiation element 3 is propagated in a direction substantially perpendicular to the second surface S2 of the substrate 2 by making the distance Dz between the first wall 7 of the sealing material 6 substantially parallel to the second surface S2 of the substrate 2 and the radiation element 3 equal to or more than the distance Dy between the second wall 8 of the sealing material 6 substantially perpendicular to the second surface S2 of the substrate 2 and the radiation element 3 and so radiation directivity can be oriented in a direction substantially perpendicular to the second surface S2 of the substrate 2, that is, the +z direction.

The surface of the sealing material 6 has a versatile and simple rectangular parallelepiped shape and the radiation directivity of an antenna can easily be oriented in a direction perpendicular to the package surface.

In FIGS. 1 and 2, the radiation element 3 is arranged between the second wall 8 of the sealing material 6 and the semiconductor chip 1. The distance Dy between the second wall of the sealing material 6 substantially perpendicular to the second surface S2 of the substrate 2 and the radiation element 3 can be decreased by arranging the radiation element 3 between the second wall 8 of the sealing material 6 and the semiconductor chip 1 and thus, Dz≥Dy can be satisfied with the short distance and the semiconductor package 100 can be made thinner.

In FIGS. 1 and 2, the semiconductor chip 1 is arranged in a position shifted in the +y direction from the center of the semiconductor package 100 when viewed from the z direction. Thus, the distance Dy between the second wall 8 of the sealing material 6 substantially perpendicular to the second surface S2 of the substrate 2 and the radiation element 3 can be decreased by the semiconductor chip 1 being shifted to the side of the radiation element 3 for arrangement and therefore, Dz≥Dy can be satisfied with the short distance Dz and the semiconductor package 100 can be made thinner.

Second Embodiment

Figure 9:
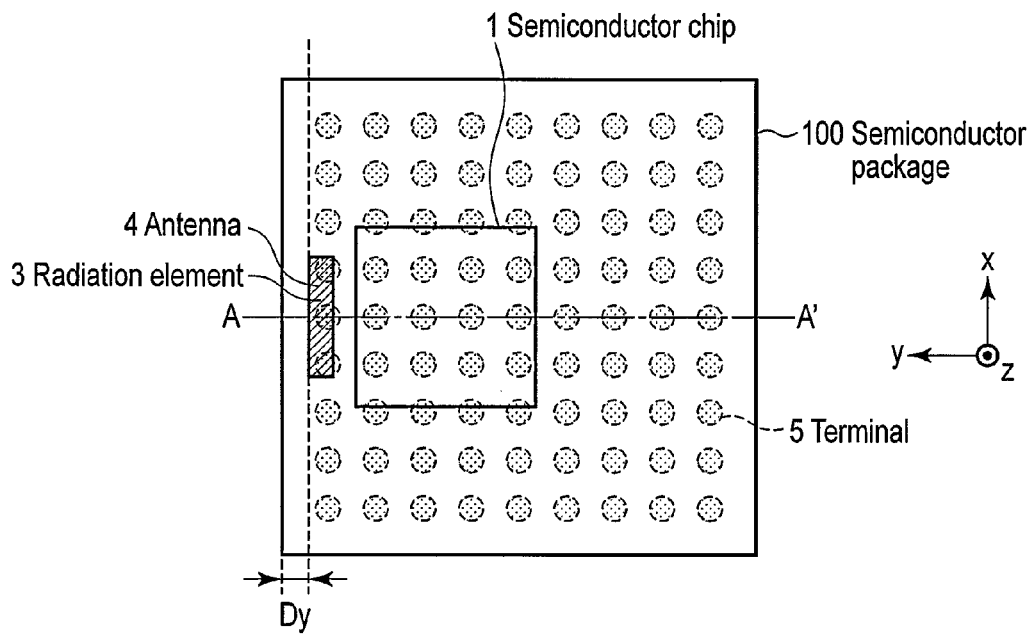
FIG. 9 is a top view showing the outline configuration of a wireless device according to a second embodiment.
Figure 10:
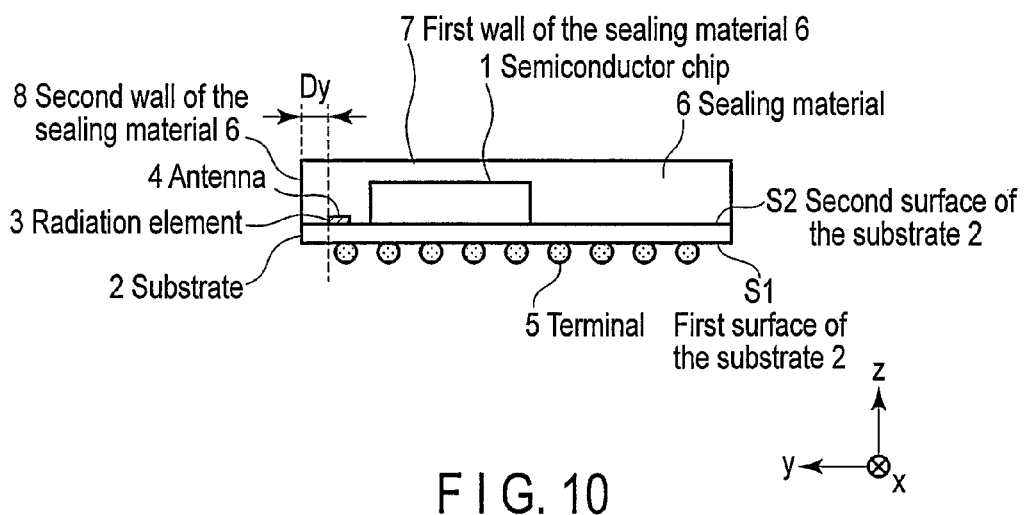
FIG. 10 is a sectional view along line A-A' in FIG. 9.

FIGS. 9 and 10 are diagrams showing the outline configuration of a wireless device according to a second embodiment. FIG. 9 is a top view and FIG. 10 is a sectional view along line A-A' in FIG. 9.

The wireless device in FIGS. 9 and 10 is configured in such a way that the distance Dy between the second wall 8 of the sealing material 6 substantially perpendicular to the second surface S2 of the substrate 2 and the radiation element 3 shown in FIGS. 1 and 2 is less than approximately half a wavelength at the operating frequency.

An aspect of making a distance Dy between a second wall 8 of a sealing material 6 substantially perpendicular to a second surface S2 of a substrate 2 and a radiation element 3 less than approximately half a wavelength at the operating frequency will be described.

Figure 11:
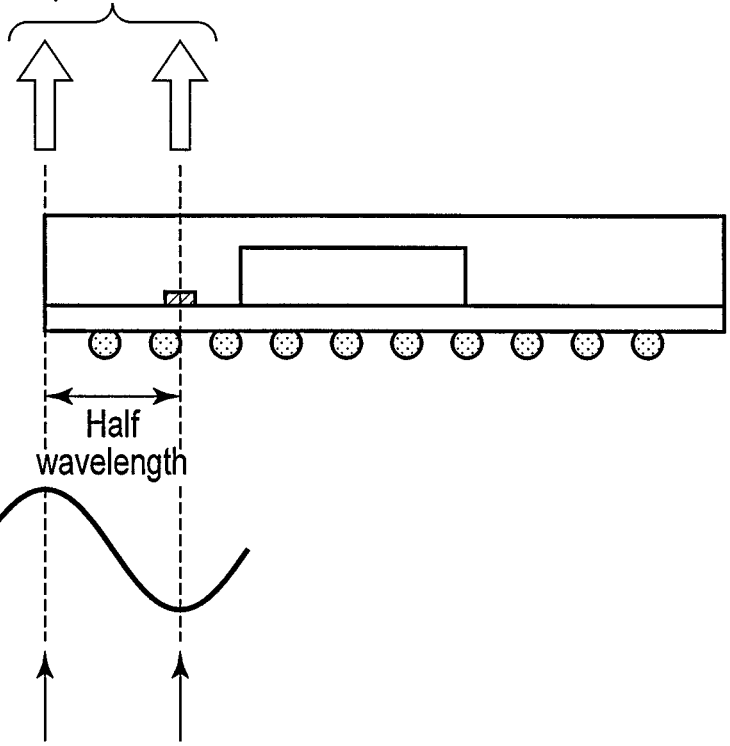
FIG. 11 is a schematic diagram when a distance Dy is approximately half a wavelength at an operating frequency.

FIG. 11 schematically shows a state in the case of the distance Dy is approximately half a wavelength at the operating frequency.

When the distance Dy between the second wall 8 of the sealing material 6 substantially perpendicular to the second surface S2 of the substrate 2 and the radiation element 3 becomes equals to or more than approximately half a wavelength at the operating frequency, as shown in FIG. 11, a plurality of antinodes where the amplitude of an electric field is high arises between the second wall 8 of the sealing material 6 substantially perpendicular to the second surface S2 of the substrate 2 and the radiation element 3.

Electric fields of adjacent antinodes have opposite phases and thus, electromagnetic waves radiated in a direction substantially perpendicular to the second surface S2 of the substrate 2 cancel out each other and the radiation directivity in a direction substantially perpendicular to the second surface S2 of the substrate 2 is weakened.

Thus, by making distance Dy between the second wall 8 of the sealing material 6 substantially perpendicular to the second surface S2 of the substrate 2 and the radiation element 3 less than approximately half a wavelength at the operating frequency, the radiation directivity in a direction substantially perpendicular to the second surface S2 of the substrate 2, that is, the +z direction can be reinforced without radiation in a direction substantially perpendicular to the second surface S2 of the substrate 2 being canceled out.

Electromagnetic field simulation results of the distribution of the electric field intensity shown in FIGS. 3 to 5 show that in FIG. 5 in which the distance Dy between the second wall 8 of the sealing material 6 substantially perpendicular to the second surface S2 of the substrate 2 and the radiation element 3 becomes equal to or more than approximately half a wavelength at the operating frequency, a plurality of antinodes where the amplitude of an electric field is high arises between the second wall 8 of the sealing material 6 substantially perpendicular to the second surface S2 of the substrate 2 and the radiation element 3.

Third Embodiment

FIGS. 12 and 13 are diagrams showing the outline configuration of a wireless device according to a third embodiment. FIG. 12 is a top view and FIG. 13 is a sectional view along line A-A' in FIG. 12.

The wireless device in FIGS. 12 and 13 is configured in such a way that the distance Dda between the semiconductor chip 1 and the radiation element 3 in FIGS. 1 and 2 is less than approximately ¾ wavelength at the operating frequency. The distance Dda is, for example, the shortest distance or the average distance between the semiconductor chip 1 and the radiation element 3.

An aspect of making a distance Dda between a semiconductor chip 1 and a radiation element 3 less than approximately ¾ wavelength at the operating frequency will be described.

Figure 14:
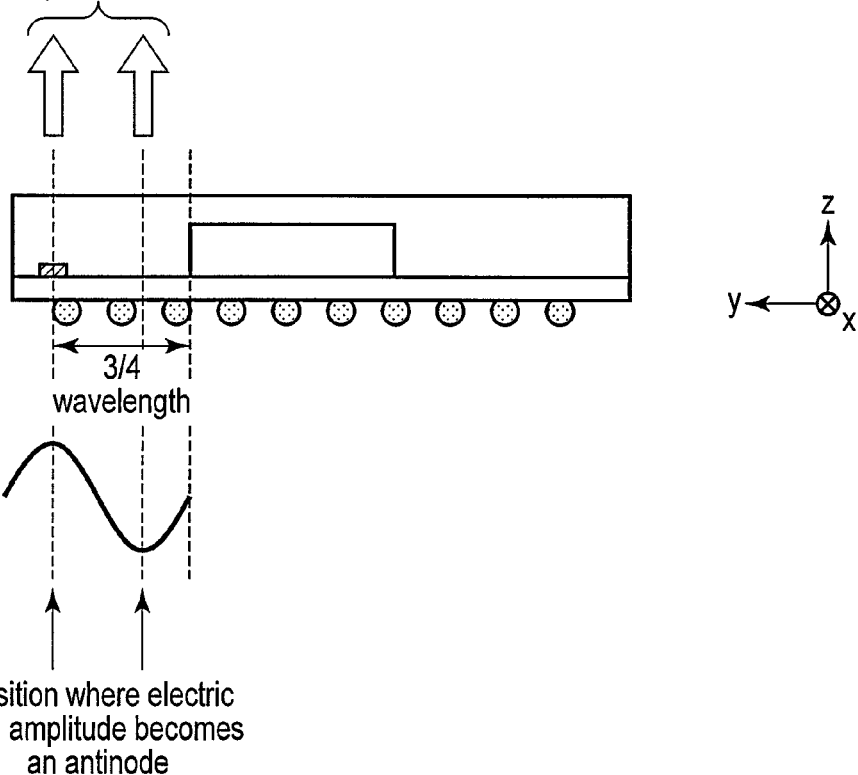
FIG. 14 is a schematic diagram when a distance Dda is approximately ¾ wavelength at the operating frequency.

FIG. 14 schematically shows a state when the distance Dda is approximately ¾ wavelength at the operating frequency in FIG. 13.

When the distance Dda between the semiconductor chip 1 and the radiation element 3 becomes equal to or more than approximately ¾ wavelength at the operating frequency, as shown in FIG. 14, a plurality of antinodes where the amplitude of an electric field is high arises between the semiconductor chip 1 and the radiation element 3.

Electric fields of adjacent antinodes have opposite phases and thus, electromagnetic waves radiated in a direction substantially perpendicular to a second surface S2 of the substrate 2 cancel out each other and the radiation directivity in a direction substantially perpendicular to the second surface S2 of the substrate 2 is weakened.

Thus, if the distance Dda between the semiconductor chip 1 and the radiation element 3 is made less than approximately ¾ wavelength at the operating frequency, the radiation directivity in a direction substantially perpendicular to the second surface S2 of the substrate 2, that is, the +z direction can be reinforced without radiation in a direction substantially perpendicular to the second surface S2 of the substrate 2 being canceled out.

Electromagnetic field simulation results when the radiation element 3 in FIGS. 12 and 13 is used as a dipole antenna will be described with reference to FIGS. 15 to 17 and 18 to 20. Terminals 5 are omitted in the simulation.

Figure 15:
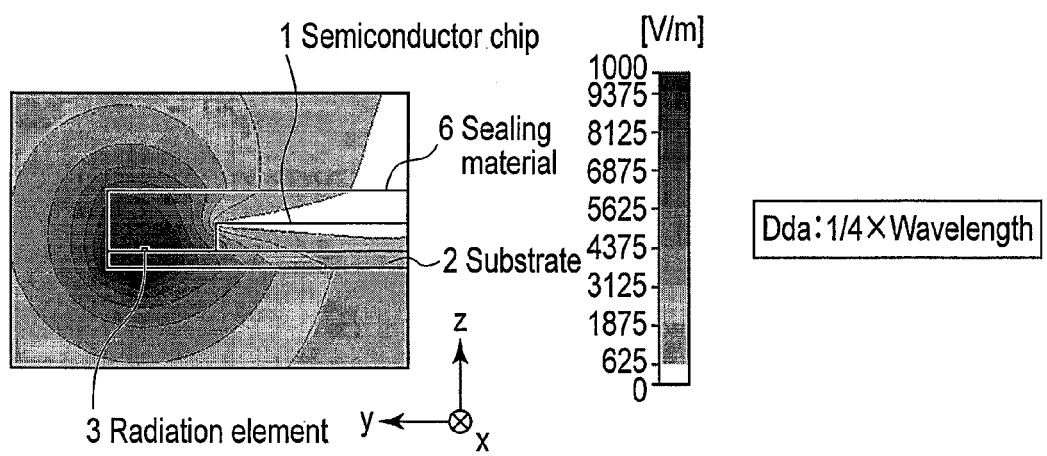
FIGS. 15-17 show electromagnetic field simulation results of the distribution of the electric field intensity.
Figure 16:
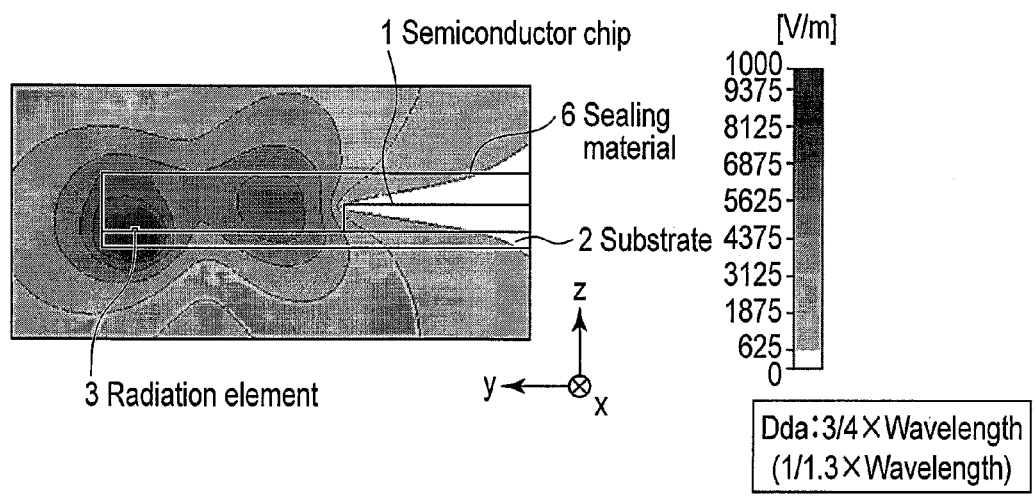
Figure 17:
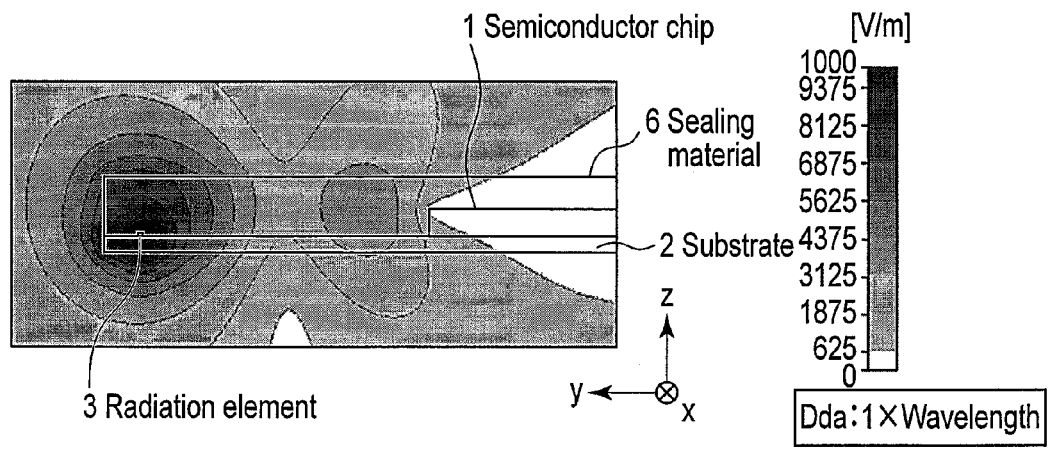

FIGS. 15 to 17 show electromagnetic field simulation results of the distribution of the electric field intensity. FIG. 15 shows a result in the case of Dda=approximately ¼ wavelength at the operating frequency, FIG. 16 shows a result in the case of Dda=approximately ¾ wavelength at the operating frequency, and FIG. 17 shows a result in the case of Dda=1 wavelength at the operating frequency.

Figure 18:
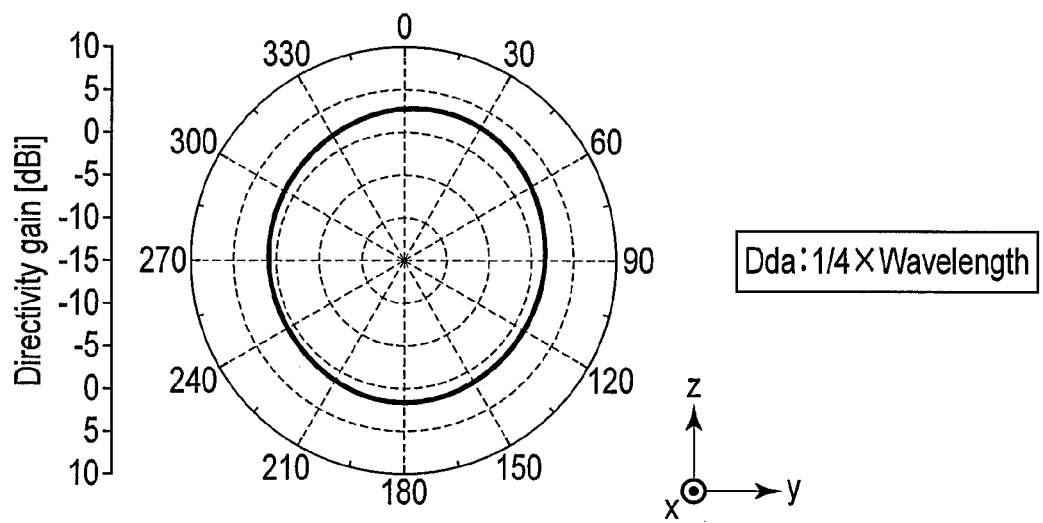
Figure 19:
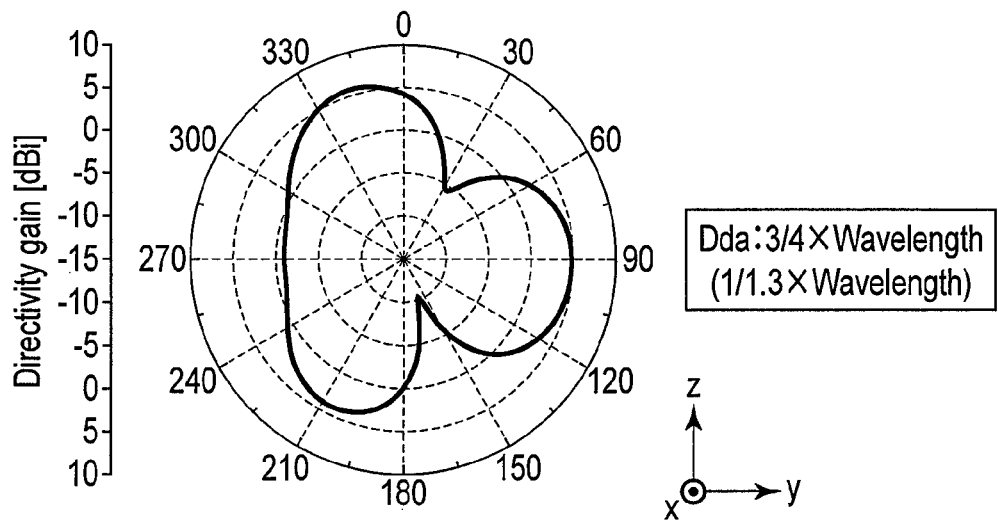

FIGS. 18 to 20 show electromagnetic field simulation results of the radiation directivity pattern. FIG. 18 shows a result in the case of Dda=approximately ¼ wavelength at the operating frequency, FIG. 19 shows a result in the case of Dda=approximately ¾ wavelength at the operating frequency, and FIG. 20 shows a result in the case of Dda=1 wavelength at the operating frequency.

FIGS. 15 to 17 and FIGS. 18 to 20 show characteristics in the cross section of the yz plane shown in FIG. 13.

When Dda is approximately ¾ wavelength at the operating frequency as shown in FIGS. 16 and 17, a plurality of antinodes where the amplitude of an electric field is high arises between the semiconductor chip 1 and the radiation element 3. As shown in FIGS. 19 and 20, nulls where directivity gains fall off arise and the radiation directivity pattern is divided, though slightly deviated from the direction substantially perpendicular to the second surface S2 of the substrate 2. On the other hand, when, as shown in FIGS. 15 to 18, Dda is less than ¾ wavelength at the operating frequency, one antinode where the amplitude of an electric field is high arises between the semiconductor chip 1 and the radiation element 3. The radiation directivity pattern is not divided and the radiation directivity is oriented in the +z direction.

By making the distance Dda between the semiconductor chip 1 and the radiation element 3 less than approximately ¾ wavelength at the operating frequency as described above, the radiation directivity in a direction substantially perpendicular to the second surface S2 of the substrate 2, that is, the +z direction can be reinforced without radiation in a direction substantially perpendicular to the second surface S2 of the substrate 2 being canceled out.

Fourth Embodiment

Figure 22:
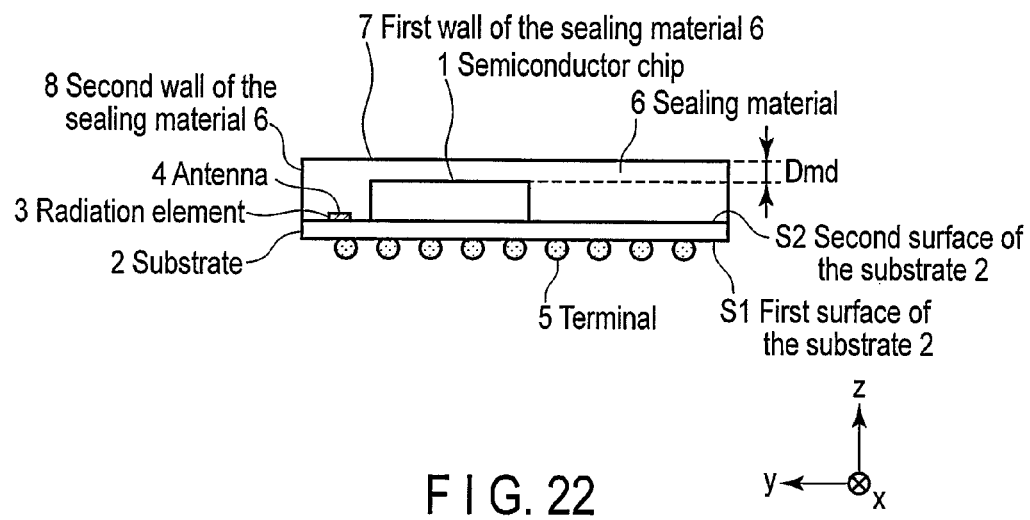
FIG. 22 is a sectional view along line A-A' in FIG. 21.

FIGS. 21 and 22 are diagrams showing the outline configuration of a wireless device according to a fourth embodiment. FIG. 21 is a top view and FIG. 22 is a sectional view along line A-A' in FIG. 21.

The wireless device in FIGS. 21 and 22 is configured in such a way that a distance Dmd between the first wall 7 of the sealing material 6 and the semiconductor chip 1 in FIGS. 1 and 2 is less than approximately ¼ wavelength at the operating frequency.

An aspect of making a distance Dmd between a first wall 7 of a sealing material 6 and a semiconductor chip 1 less than approximately ¼ wavelength at the operating frequency will be described.

When the distance Dmd between the first wall 7 of the sealing material 6 and the semiconductor chip 1 becomes equal to or more than approximately ¼ wavelength at the operating frequency, antinodes where the amplitude of an electric field is high arise between the semiconductor chip 1 and the first wall 7 of the sealing material 6 and an electromagnetic field generated by the radiation element 3 is propagated in the −y direction. Accordingly, the radiation directivity in the −y direction is reinforced and the radiation directivity in a direction substantially perpendicular to a second surface S2 of the substrate 2 is weakened.

Thus, if the distance Dmd between the first wall 7 of the sealing material 6 and the semiconductor chip 1 is made less than approximately ¼ wavelength at the operating frequency, deterioration of the radiation directivity in a direction substantially perpendicular to the second surface S2 of the substrate 2 by the radiation directivity in the −y direction being reinforced is suppressed so that the radiation directivity in a direction substantially perpendicular to the second surface S2 of the substrate 2, that is, the +z direction can be reinforced.

Electromagnetic field simulation results when a radiation element 3 in FIGS. 21 and 22 is used as a dipole antenna will be described with reference to FIGS. 23 and 24, and 25 and 26. Terminals 5 are omitted in the simulation.

Figure 23:
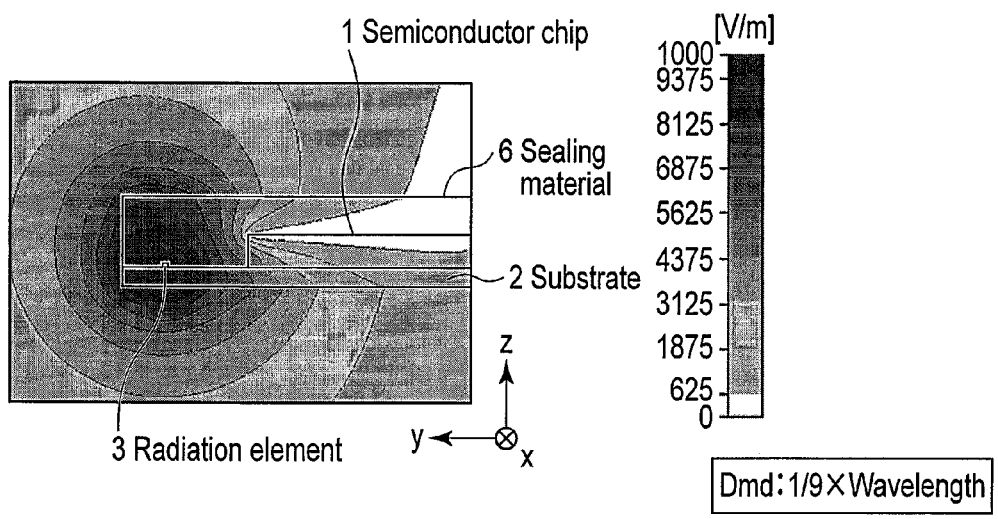
FIGS. 23-24 show electromagnetic field simulation results of the distribution of the electric field intensity.
Figure 24:
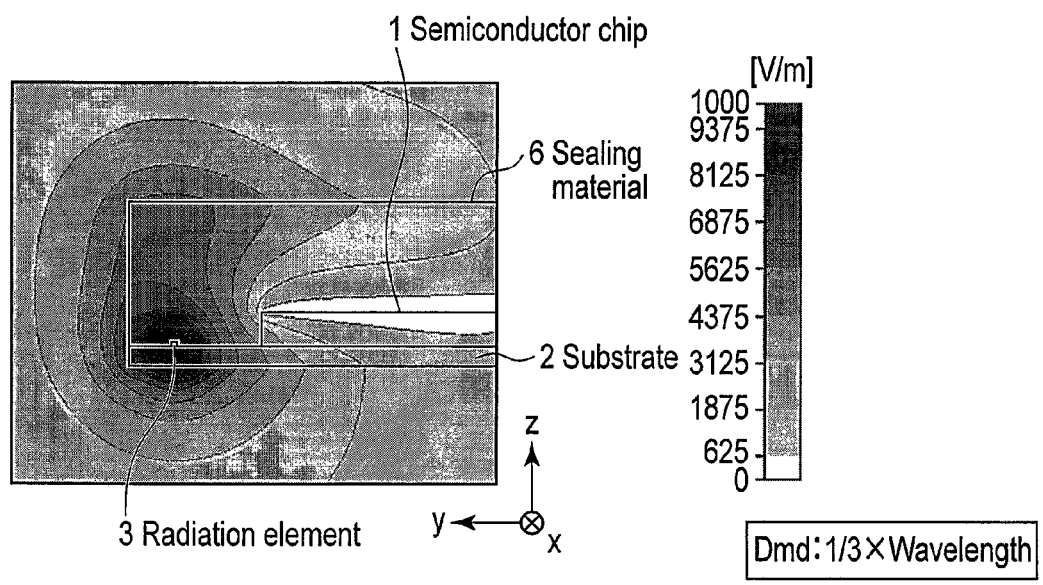

FIGS. 23 and 24 show electromagnetic field simulation results of the distribution of the electric field intensity. FIG. 23 shows a result in the case of Dmd=approximately ⅙ wavelength at the operating frequency and FIG. 24 shows a result in the case of Dmd=approximately ⅓ wavelength at the operating frequency.

Figure 25:
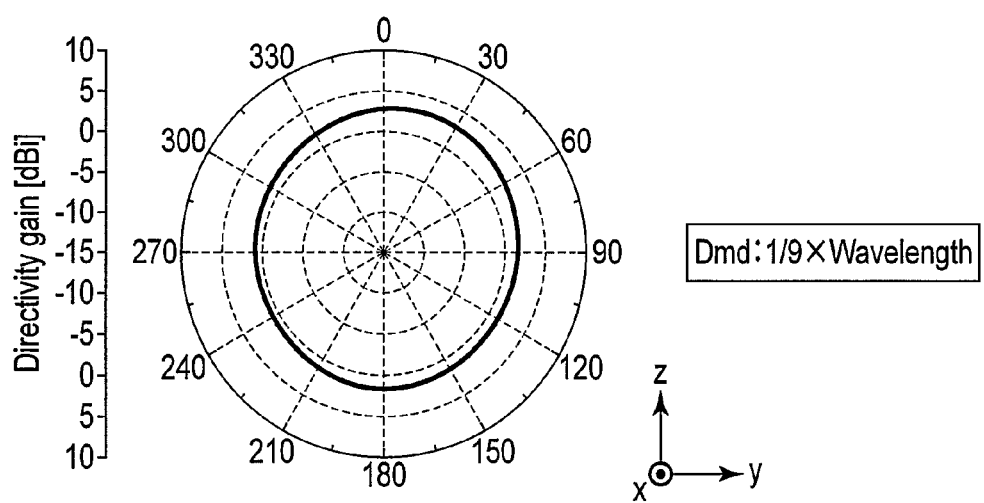
FIGS. 25-26 show electromagnetic field simulation results of the radiation directivity pattern.
Figure 26:
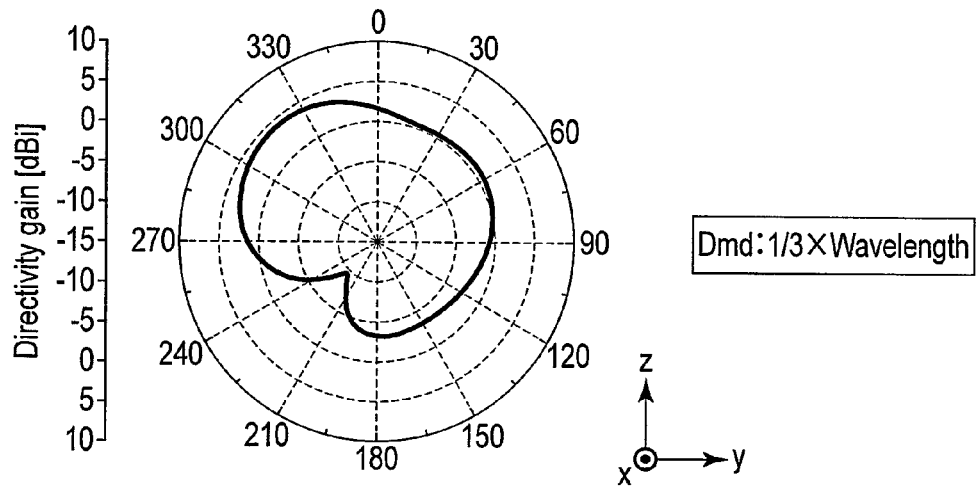

FIGS. 25 and 26 show electromagnetic field simulation results of the radiation directivity pattern. FIG. 25 shows a result in the case of Dmd=approximately ⅙ wavelength at the operating frequency and FIG. 26 shows a result in the case of Dmd=approximately ⅓ wavelength at the operating frequency.

FIGS. 23 and 24, and 25 and 26 show characteristics in the cross section of the yz plane shown in FIG. 22.

When, as shown in FIG. 24, the distance Dmd between the first wall 7 of the sealing material 6 and the semiconductor chip 1 is equal to or more than approximately ¼ wavelength at the operating frequency, antinodes where the amplitude of an electric field is high arise between the semiconductor chip 1 and the first wall 7 of the sealing material 6. In FIG. 26, the radiation directivity is reinforced on the −y side, though slightly deviated from the −y direction. On the other hand, when, as shown in FIGS. 23 and 25, the distance Dmd between the first wall 7 of the sealing material 6 and the semiconductor chip 1 is less than approximately ¼ wavelength at the operating frequency, an electromagnetic field generated by the radiation element 3 is not propagated in the −y direction and the radiation directivity on the −y side is not reinforced.

By making the distance Dmd between the first wall 7 of the sealing material 6 and the semiconductor chip 1 less than approximately ¼ wavelength at the operating frequency as described above, the radiation directivity in a direction substantially parallel to the second surface S2 of the substrate 2, that is, on the −y side can be inhibited from being reinforced and the radiation directivity in a direction substantially perpendicular to the second surface S2 of the substrate 2, that is, the +z direction can be reinforced.

Fifth Embodiment

Figure 27:
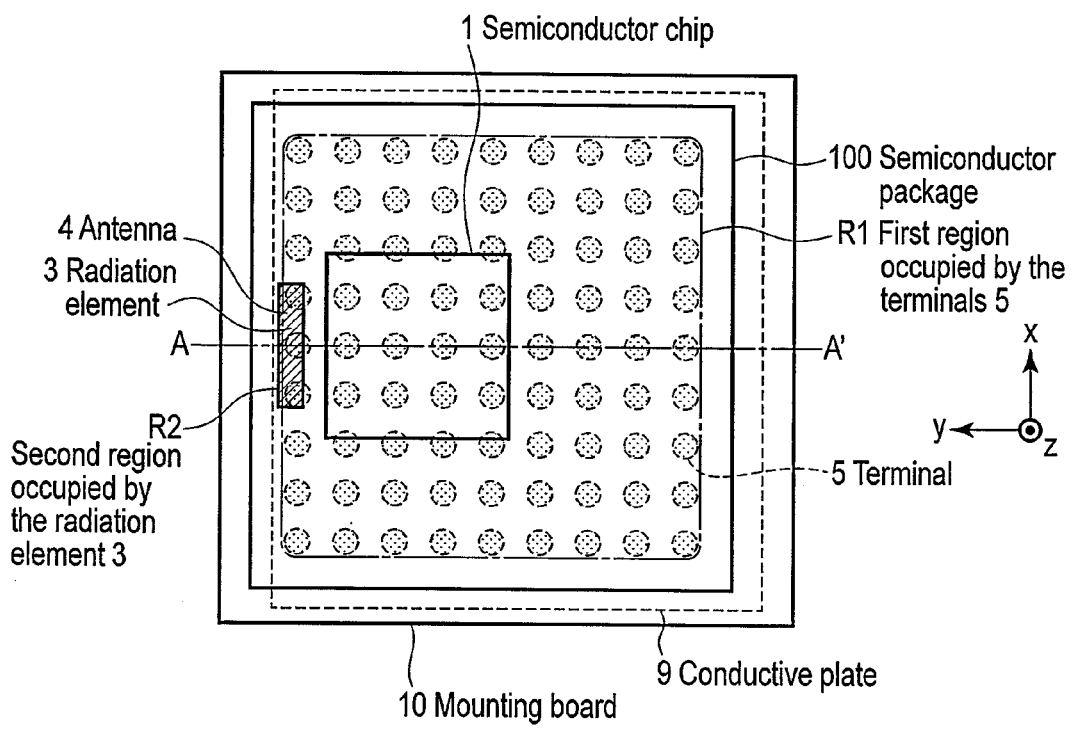
FIG. 27 is a top view showing the outline configuration of a wireless device according to a fifth embodiment.

FIGS. 27 and 28 are diagrams showing the outline configuration of a wireless device according to a fifth embodiment. FIG. 27 is a top view and FIG. 28 is a sectional view along line A-A' in FIG. 27.

The wireless device in FIGS. 27 and 28 has a configuration in which the semiconductor package 100 in FIGS. 1 and 2 is mounted on a mounting board 10 having a conductive plate 9.

The conductive plate 9 in FIGS. 27 and 28 is provided in an intermediate layer of the mounting board 10, but may also be provided on the surface of the mounting board 10. The mounting board 10 may have a 1-layer structure or multi-layer structure.

The conductive plate 9 contains a first region R1 occupied by terminals 5 when viewed from a direction perpendicular to a second surface S2 of a substrate 2 and a second region R2 occupied by radiation elements 3 when viewed from the direction perpendicular to the second surface S2 of the substrate 2.

The conductive plate 9 is preferably formed, for example, as a ground pattern or power supply pattern occupying a relatively wide region. In addition, the conductive plate 9 may also be formed, for example, as a floating conductor pattern.

Because the conductive plate 9 of the mounting board 10 contains the region R1 occupied by the terminals 5, the terminals 5 and the conductive plate 9 can be connected on the shortest path by vias (not shown) or the like without a wire being put around and thus, a parasitic component due to the connection can be minimized and if the conductive plate 9 is a ground or power supply pattern, the ground or power supply can be reinforced.

The conductive plate 9 of the mounting board 10 contains the second region R2 occupied by the radiation elements 3 and so the conductive plate 9 operates as a reflector of the radiation element 3. The reflector is arranged in the −z direction when viewed from the radiation element 3 and thus, the radiation directivity in the +z direction can be reinforced.

Electromagnetic field simulation results when the radiation element 3 in FIGS. 27 and 28 is used as a dipole antenna will be described with reference to FIGS. 29 and 30. The terminals 5 and the mounting board 10 are omitted in the simulation. FIG. 29 is an electromagnetic field simulation result of the distribution of the electric field intensity and FIG. 30 is an electromagnetic field simulation result of a radiation directivity pattern. FIGS. 29 and 30 show characteristics in the cross section of the yz plane shown in FIG. 28.

It is clear that the radiation directivity is further reinforced in the +z direction when compared with a case in FIGS. 1 and 2 by the conductive plate 9 being operated as a reflector.

By mounting the semiconductor package 100 on the mounting board 10 having the conductive plate 9 and configuring the conductive plate 9 so as to contain the first region R1 occupied by the terminals 5 when viewed from a direction perpendicular to the second surface S2 of the substrate 2 and the second region R2 occupied by the radiation elements 3 when viewed from a direction perpendicular to the second surface S2 of the substrate 2 as described above, the terminals 5 and the conductive plate 9 can be connected on the shortest path by vias or the like and thus, a parasitic component due to the connection can be minimized and the ground or power supply can be reinforced and also, the radiation directivity in the +z direction can further be reinforced by the conductive plate 9 being operated as a reflector of the radiation element 3.

(2) The sixth to ninth embodiments below relate to a wireless device capable of orienting the radiation directivity of an antenna in a direction parallel to the package surface.

Sixth Embodiment

FIGS. 31 and 32 are diagrams showing the outline configuration of a wireless device according to a sixth embodiment. FIG. 31 is a top view and FIG. 32 is a sectional view along line A-A' in FIG. 31.

As shown in FIGS. 31 and 32, a wireless device according to the present embodiment includes a semiconductor chip 1 containing a wireless circuit, a substrate 2, and an antenna 4 containing a radiation element 3 electrically connected to the semiconductor chip 1. Here, a case when the wireless device is configured by a semiconductor package 100 including these elements 1 to 4 is taken as an example to describe the embodiments.

A plurality of terminals 5 is arranged on a first surface S1 of the substrate 2 and the semiconductor chip 1 is arranged on a second surface S2, which is different from the first surface S1, of the substrate 2. The semiconductor chip 1 and the radiation element 3 are sealed by a sealing material 6. The radiation element 3 may be embedded in a resist (not shown) of the substrate 2.

The semiconductor package 100 in FIGS. 31 and 32 is a BGA (Ball Grid Array) package including the terminals 5 formed from solder balls on the first surface S1 of the substrate 2.

However, the semiconductor package 100 is not limited to the BGA package and may be, for example, another kind of package. In addition, the wireless device is not limited to the package. For example, the wireless device may be a module comprising a semiconductor chip and a substrate.

Only the semiconductor chip 1 is mounted on the substrate 2 in the example of FIGS. 31 and 32, but the present embodiment is not limited to such an example. For example, in addition to the semiconductor chip 1, the substrate 2 may have components (not shown), for example, a chip capacitor or IC mounted thereon.

The semiconductor chip 1 is formed of a semiconductor substrate of, for example, silicon, silicon germanium, gallium arsenide or the like and has a metallic pattern of, for example, copper, aluminum, gold or the like formed inside or on a surface layer thereof. Incidentally, the semiconductor chip 1 may be a dielectric substrate, magnetic substrate, metal, or a combination thereof. Alternatively, the semiconductor chip 1 may be constituted of CSP (Chip Size Package). The number of the semiconductor chips 1 is one in FIGS. 31 and 32, but may be more than one and semiconductor chips may be stacked or aligned horizontally. The semiconductor chip 1 has a rectangular parallelepiped shape in FIGS. 31 and 32, but is not limited to the rectangular parallelepiped shape and may have, for example, any prism shape, any cylindrical shape, or any other complex shapes.

The semiconductor chip 1 is electrically connected to a wire of the substrate 2 or the ground (not shown) through a bonding wire or bump or the like.

The radiation element 3 in FIGS. 31 and 32 is formed on the second surface S2 of the substrate 2. The radiation element 3 is electrically connected to an antenna terminal (not shown) of the semiconductor chip 1 by, for example, a bonding wire, bump, transmission line or the like. The radiation element 3 is a part or the whole of the antenna 4.

The relation between the antenna 4 and the radiation element 3 is as described in the first embodiment.

The radiation element 3 may be formed, as shown in FIGS. 31 and 32, on the substrate 2 or formed of a bonding wire or bump or the like (not shown). The radiation element 3 is, for example, a part or the whole of a dipole antenna, loop antenna, inverted F antenna, or patch antenna. The number of the radiation elements 3 is one in FIGS. 31 and 32, but the number thereof may be more than one.

The sealing material 6 in FIGS. 31 and 32 is made of, for example, a dielectric such as resin. The sealing material 6 may be formed of another dielectric, for example, ceramic. The surface of the sealing material 6 in FIGS. 31 and 32 has a simple rectangular parallelepiped shape and can easily be formed by a versatile molding.

The semiconductor package 100 in FIGS. 31 and 32 is configured in such a way that a distance Dy between a second wall 8 of the sealing material 6 substantially perpendicular to the second surface S2 of the substrate 2 and the radiation element 3 is longer than a distance Dz between a first wall 7 of the sealing material 6 substantially parallel to the second surface S2 of the substrate 2 and the radiation element 3 (that is, Dy>Dz holds) and also the distance Dy between the second wall 8 of the sealing material 6 substantially perpendicular to the second surface S2 of the substrate 2 and the radiation element 3 is equal to or more than approximately half a wavelength at the operating frequency. The distance Dy is, for example, the shortest distance or the average distance between the wall 8 of the sealing material 6 and the radiation element 3.

An electromagnetic field is pulled toward a higher dielectric constant. The sealing material 6 formed of a dielectric has a higher dielectric constant than the ambient air. Therefore, by making the distance Dy between the second wall 8 of the sealing material 6 substantially perpendicular to the second surface S2 of the substrate 2 and the radiation element 3 longer than the distance Dz between the first wall 7 of the sealing material 6 substantially parallel to the second surface S2 of the substrate 2 and the radiation element 3, an electromagnetic field generated by the radiation element 3 is propagated in a direction toward the side of the second wall 8 of the sealing material 6 substantially perpendicular to the second surface S2 of the substrate 2 when viewed from the radiation directivity 3, that is, the +y direction in a direction substantially parallel to the second surface S2 of the substrate 2 and thus, the radiation directivity can be oriented in the +y direction.

An aspect of making the distance Dy between the second wall 8 of the sealing material 6 substantially perpendicular to the second surface S2 of the substrate 2 and the radiation element 3 equals to or more than approximately half a wavelength at the operating frequency will be described.

FIG. 11 schematically shows a state in the case of the distance Dy is approximately half a wavelength at the operating frequency.

When the distance Dy between the second wall 8 of the sealing material 6 substantially perpendicular to the second surface S2 of the substrate 2 and the radiation element 3 becomes equal to or more than approximately half a wavelength at the operating frequency, as shown in FIG. 11, a plurality of antinodes where the amplitude of an electric field is high arises between the second wall 8 of the sealing material 6 substantially perpendicular to the second surface S2 of the substrate 2 and the radiation element 3.

Electric fields of adjacent antinodes have opposite phases and thus, electromagnetic waves radiated in a direction substantially perpendicular to a second surface S2 of the substrate 2 cancel out each other. As a result, the radiation directivity in a direction perpendicular to the second surface S2 of the substrate 2 is weakened and the radiation directivity in a direction parallel to the second surface S2 of the substrate 2 is reinforced.

Electromagnetic field simulation results when the radiation element 3 in FIGS. 31 and 32 is used as a dipole antenna will be described with reference to FIGS. 3 to 5 and 6 to 8. As described above, the terminals 5 are omitted in the simulation.

FIGS. 3 to 5 show electromagnetic field simulation results of the distribution of the electric field intensity when Dz/Dy=1.6 and Dy=approximately ⅛ wavelength at the operating frequency, Dz/Dy=0.6 and Dy=approximately ⅓ wavelength at the operating frequency, and Dz/Dy=0.3 and Dy=approximately 1/1.5 wavelength at the operating frequency respectively.

FIGS. 6 to 8 show electromagnetic field simulation results of a radiation directivity pattern when Dz/Dy=1.6 and Dy=approximately ⅛ wavelength at the operating frequency, Dz/Dy=0.6 and Dy=approximately ⅓ wavelength at the operating frequency, and Dz/Dy=0.3 and Dy=approximately 1/1.5 wavelength at the operating frequency respectively.

FIGS. 3 to 5 and FIGS. 6 to 8 show characteristics in the cross section of the yz plane shown in FIG. 32.

Referring to FIGS. 3 to 5 and FIGS. 6 to 8 shows that the electric field is pulled in the +y direction and the radiation directivity is oriented in the +y direction with an decreasing ratio Dz/Dy of Dz and Dy and, on the other hand, the electric field is pulled in the +z direction and the radiation directivity is oriented in the +z direction with an increasing ratio Dz/Dy.

In FIG. 5 in which the distance Dy between the second wall 8 of the sealing material 6 substantially perpendicular to the second surface S2 of the substrate 2 and the radiation element 3 becomes equal to or more than approximately half a wavelength at the operating frequency, a plurality of antinodes where the amplitude of an electric field is high arises between the second wall 8 of the sealing material 6 substantially perpendicular to the second surface S2 of the substrate 2 and the radiation element 3. As a result, the radiation directivity in a direction substantially perpendicular to the second surface S2 of the substrate 2, that is, the +z direction is weakened and an electromagnetic field generated by the radiation element 3 is propagated in a direction toward the side of the second wall 8 of the sealing material 6 substantially perpendicular to the second surface S2 of the substrate 2 when viewed from the radiation directivity 3, that is, the +y direction in a direction substantially parallel to the second surface S2 of the substrate 2 and thus, the radiation directivity is reinforced in the +y direction.

Thus, by making the distance Dy between the second wall 8 of the sealing material 6 substantially perpendicular to the second surface S2 of the substrate 2 and the radiation element 3 longer than the distance Dz between the first wall 7 of the sealing material 6 substantially parallel to the second surface S2 of the substrate 2 and the radiation element 3 and also the distance Dy between the second wall 8 of the sealing material 6 substantially perpendicular to the second surface S2 of the substrate 2 and the radiation element 3 equal to or more than half a wavelength at the operating frequency, the radiation directivity can be oriented in a direction toward the side of the second wall 8 of the sealing material 6 substantially perpendicular to the second surface S2 of the substrate 2 when viewed from the radiation element 3, that is, the +y direction in a direction substantially parallel to the second surface S2 of the substrate 2.

The surface of the sealing material 6 has a versatile and simple rectangular parallelepiped shape and the radiation directivity of an antenna can easily be oriented in a direction parallel to the package surface.

In FIGS. 31 and 32, the radiation element 3 is arranged in a region on the inner side from the terminals 5 of the outermost circumference. With the radiation element 3 being arranged in a region on the inner side from the terminal 5 of the outermost circumference, the terminal 5 can be arranged closer to the outer side of the semiconductor package 100 so that the space can be utilized effectively and the distance Dy between the second wall 8 of the sealing material 6 substantially perpendicular to the second surface S2 of the substrate 2 and the radiation element 3 can efficiently be made longer.

In FIGS. 31 and 32, the semiconductor chip 1 is arranged in a position shifted in the −y direction from the center of the semiconductor package 100 when viewed from the z direction. Thus, by shifting the semiconductor chip 1 to the side of the semiconductor chip 1 when viewed from the radiation element 3, that is, the −y side for arrangement, the region on the side of the radiation element 3, that is, the +y side rather than the semiconductor chip 1 can be secured and the distance Dy between the second wall 8 of the sealing material 6 substantially perpendicular to the second surface S2 of the substrate 2 and the radiation element 3 can efficiently be made longer.

Seventh Embodiment

Figure 34:
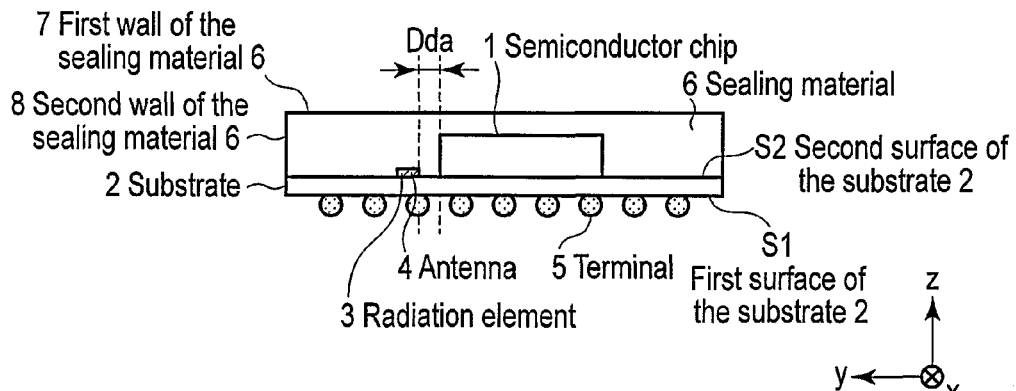
FIG. 34 is a sectional view along line A-A' in FIG. 33.

FIGS. 33 and 34 are diagrams showing the outline configuration of a wireless device according to a seventh embodiment. FIG. 33 is a top view and FIG. 34 is a sectional view along line A-A' in FIG. 33.

The wireless device in FIGS. 33 and 34 is configured in such a way that the distance Dda between the semiconductor chip 1 and the radiation element 3 in FIGS. 31 and 32 is less than approximately half a wavelength at the operating frequency. The distance Dda is, for example, the shortest distance or the average distance between the semiconductor chip 1 and the radiation element 3.

An aspect of making a distance Dda between a semiconductor chip 1 and a radiation element 3 less than approximately half a wavelength at the operating frequency will be described.

Figure 35:
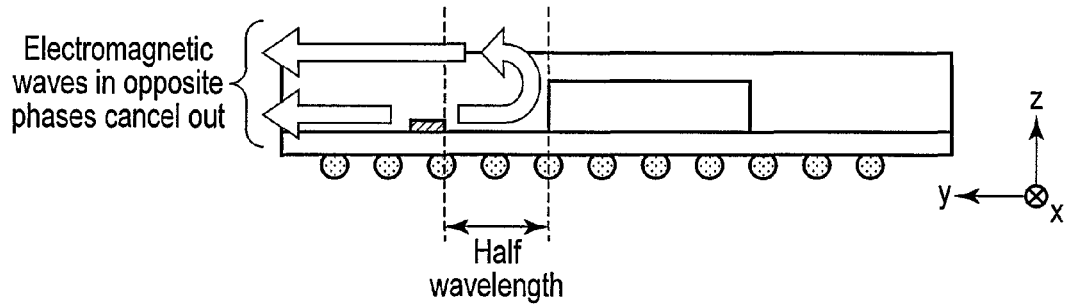
FIG. 35 is a schematic diagram when the distance Dda is approximately half a wavelength at the operating frequency.

FIG. 35 schematically shows a state when the distance Dda is approximately half a wavelength at the operating frequency in FIG. 34.

If the distance Dda between the semiconductor chip 1 and the radiation element 3 is less than approximately half a wavelength at the operating frequency, the semiconductor chip 1 serves as a reflector and the radiation directivity from the semiconductor chip 1 to the side of the radiation element 3 can be reinforced. If the distance Dda between the semiconductor chip 1 and the radiation element 3 becomes equal to approximately half a wavelength at the operating frequency, as shown in FIG. 35, an electromagnetic wave radiated directly in the +y direction from the radiation element 3 and an electromagnetic wave radiated in the −y direction from the radiation element 3 and reflected by the semiconductor chip 1 to radiate in the +y direction have mutually opposite phases, canceling out the radiation each other. Therefore, by making the distance Dda between the semiconductor chip 1 and the radiation element 3 less than approximately half a wavelength at the operating frequency, the radiation directivity in a direction substantially parallel to the second surface S2 of the substrate 2, that is, the +y direction can be reinforced without the radiation in a direction toward the side of the second wall 8 of the sealing material 6 substantially perpendicular to the second surface S2 of the substrate 2 when viewed from the radiation element 3, that is, the +y direction being canceled out.

Eighth Embodiment

Figure 36:
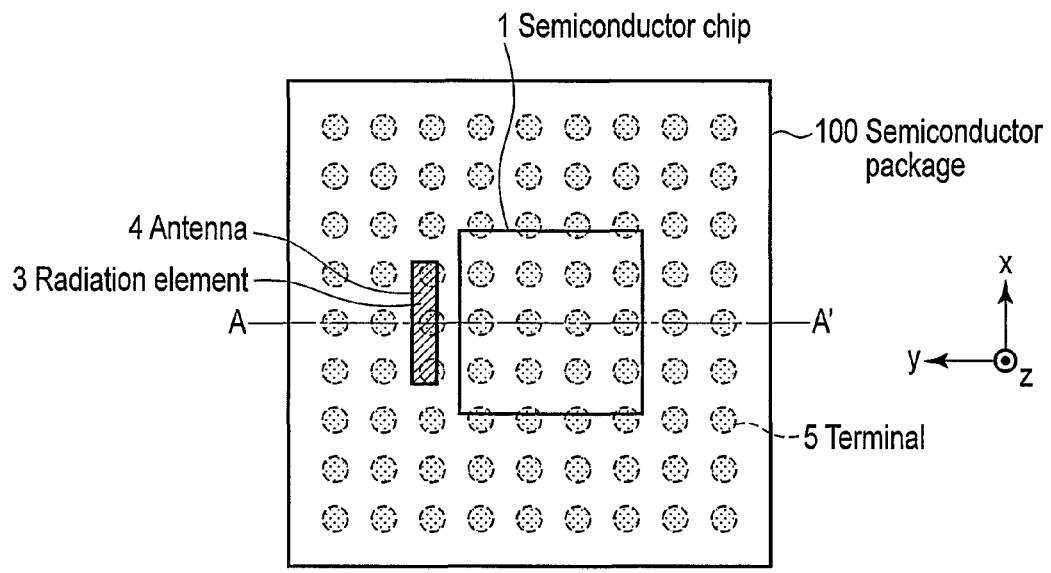
FIG. 36 is a top view showing the outline configuration of a wireless device according to an eighth embodiment.

FIGS. 36 and 37 are diagrams showing the outline configuration of a wireless device according to an eighth embodiment. FIG. 36 is a top view and FIG. 37 is a sectional view along line A-A' in FIG. 36.

The wireless device in FIGS. 36 and 37 is configured in such a way that a distance Dmd between the first wall 7 of the sealing material 6 and the semiconductor chip 1 in FIGS. 31 and 32 is less than approximately ¼ wavelength at the operating frequency.

An aspect of making a distance Dmd between a first wall 7 of a sealing material 6 and a semiconductor chip 1 less than approximately ¼ wavelength at the operating frequency will be described.

When the distance Dmd between the first wall 7 of the sealing material 6 and the semiconductor chip 1 becomes equal to or more than approximately ¼ wavelength at the operating frequency, antinodes where the amplitude of an electric field is high arise between the semiconductor chip 1 and the first wall 7 of the sealing material 6 and an electromagnetic field generated by the radiation element 3 is propagated in the −y direction. Accordingly, the radiation directivity in the −y direction is reinforced and the radiation directivity in the +y direction is reinforced.

Thus, if the distance Dmd between the first wall 7 of the sealing material 6 and the semiconductor chip 1 is made less than approximately ¼ wavelength at the operating frequency, deterioration of the radiation directivity in the +y direction with the reinforced radiation directivity in the −y direction is suppressed so that the radiation directivity in the +y direction can be reinforced.

Electromagnetic field simulation results when the radiation element 3 in FIGS. 36 and 37 is used as a dipole antenna will be described with reference to FIGS. 38 and 39, and 40 and 41. Terminals 5 are omitted in the simulation.

Figure 39:
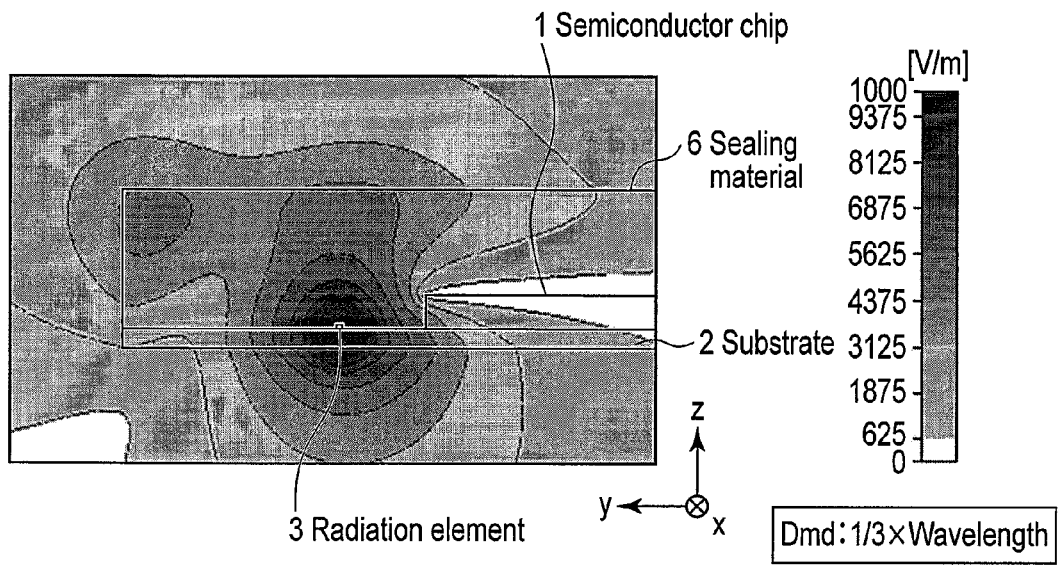

FIGS. 38 and 39 show electromagnetic field simulation results of the distribution of the electric field intensity. FIG. 38 shows a result in the case of Dmd=approximately ⅑ wavelength at the operating frequency and FIG. 39 shows a result in the case of Dmd=approximately ⅓ wavelength at the operating frequency.

Figure 40:
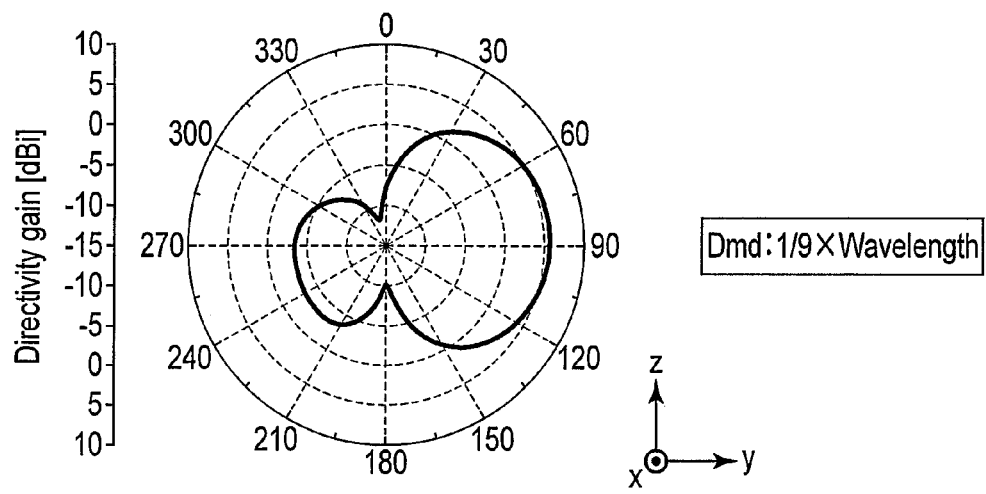
FIGS. 40-41 show electromagnetic field simulation results of the radiation directivity pattern.
Figure 41:
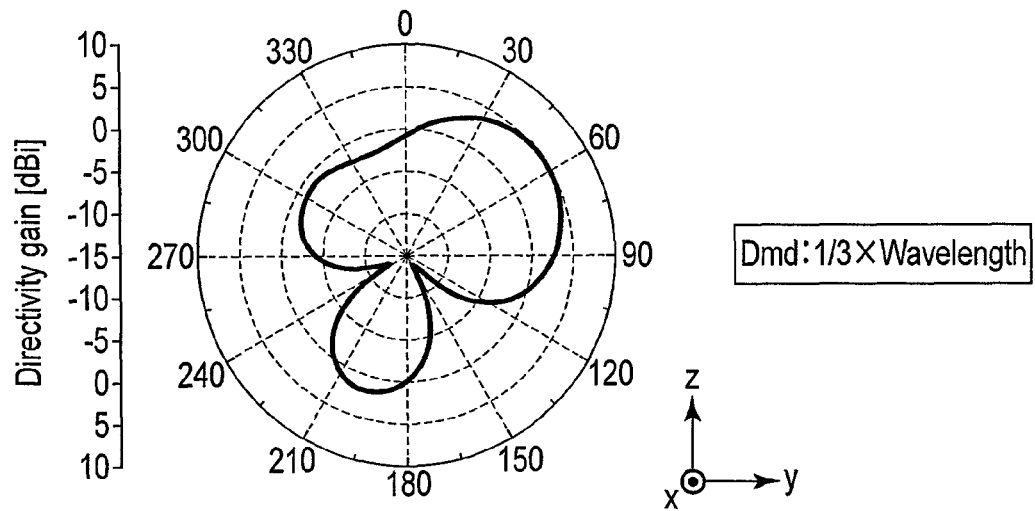

FIGS. 40 and 41 show electromagnetic field simulation results of a radiation directivity pattern. FIG. 40 shows a result in the case of Dmd=approximately ⅑ wavelength at the operating frequency and FIG. 41 shows a result in the case of Dmd=approximately ⅓ wavelength at the operating frequency.

FIGS. 38 and 39, and 40 and 41 show characteristics in the cross section of the yz plane shown in FIG. 37.

When, as shown in FIG. 39, the distance Dmd between the first wall 7 of the sealing material 6 and the semiconductor chip 1 is equal to or more than approximately ¼ wavelength at the operating frequency, antinodes where the amplitude of an electric field is high arise between the semiconductor chip 1 and the first wall 7 of the sealing material 6. In FIG. 41, the radiation directivity is reinforced on the −y side, though slightly deviated from the −y direction. On the other hand, when, as shown in FIGS. 38 and 40, the distance Dmd between the first wall 7 of the sealing material 6 and the semiconductor chip 1 is less than approximately ¼ wavelength at the operating frequency, an electromagnetic field generated by the radiation element 3 is not propagated in the −y direction and the radiation directivity on the −y side is not reinforced.

By making the distance Dmd between the first wall 7 of the sealing material 6 and the semiconductor chip 1 less than approximately ¼ wavelength at the operating frequency as described above, the radiation directivity on the −y side can be inhibited from being reinforced and in a direction substantially parallel to the second surface S2 of the substrate 2, the radiation directivity in a direction toward the side of the second wall 8 of the sealing material 6 substantially perpendicular to the second surface S2 of the substrate 2 when viewed from the radiation element 3, that is, the +y direction can be reinforced.

Ninth Embodiment

Figure 42:
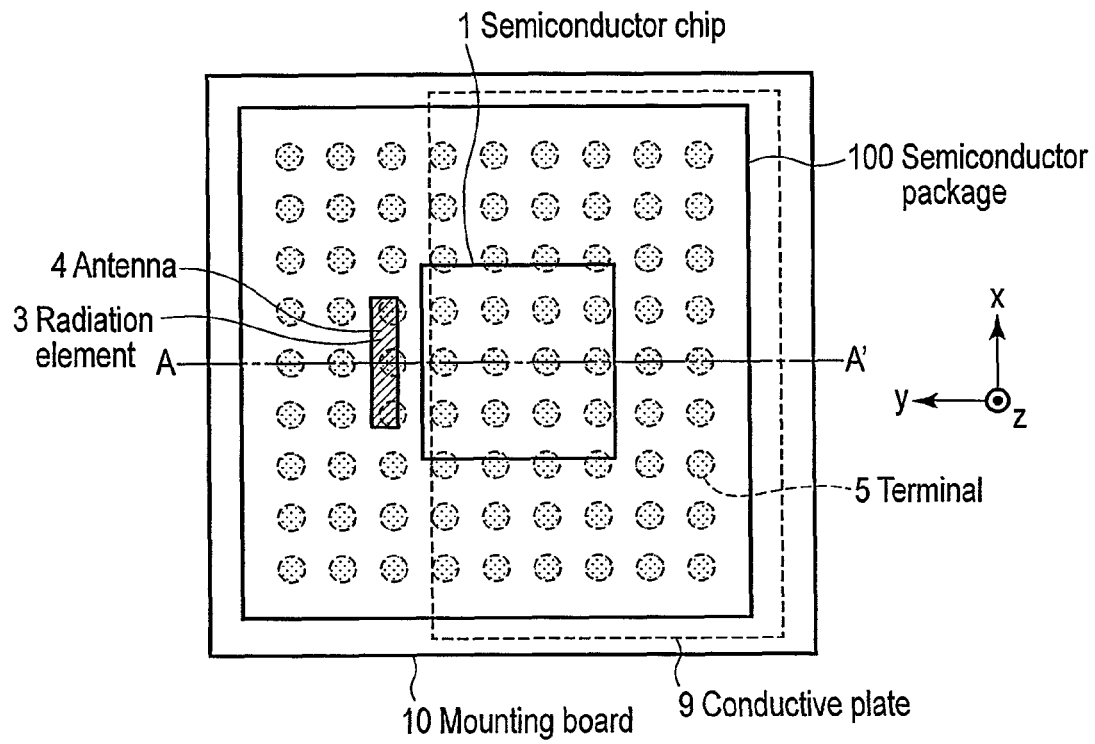
FIG. 42 is a top view showing the outline configuration of a wireless device according to a ninth embodiment.
Figure 43:
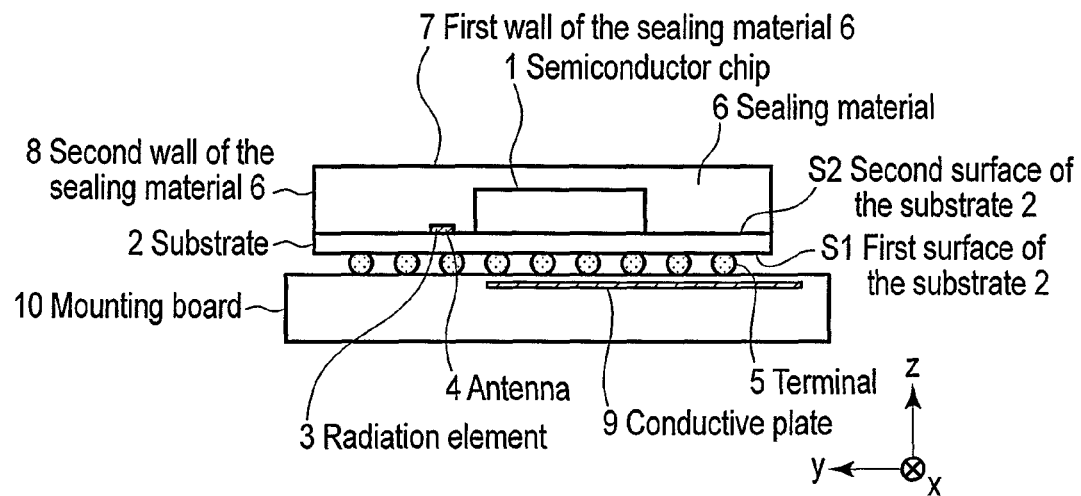
FIG. 43 is a sectional view along line A-A' in FIG. 42.

FIGS. 42 and 43 are diagrams showing the outline configuration of a wireless device according to a ninth embodiment. FIG. 42 is a top view and FIG. 43 is a sectional view along line A-A' in FIG. 42.

The wireless device in FIGS. 42 and 43 has a configuration in which the semiconductor package 100 in FIGS. 31 and 32 is mounted on a mounting board 10 having a conductive plate 9.

The conductive plate 9 in FIGS. 42 and 43 is provided in an intermediate layer of the mounting board 10, but may also be provided on the surface of the mounting board 10. The mounting board 10 may have a 1-layer structure or multi-layer structure.

When viewed from a direction perpendicular to the second surface S2 of the substrate 2, the conductive plate 9 is arranged on the side of the semiconductor chip 1 from the region occupied by the radiation element 3. That is, when viewed from a direction perpendicular to the second surface S2 of the substrate 2, the conductive plate 9 is arranged on the side of the −y direction from the region occupied by the radiation element 3.

The conductive plate 9 is preferably formed, for example, as a ground pattern or power supply pattern occupying a relatively wide region. In addition, the conductive plate 9 may also be formed, for example, as a floating conductor pattern.

Because, when viewed from a direction perpendicular to a second surface S2 of a substrate 2, the conductive plate 9 of the mounting board 10 is arranged on the side of the semiconductor chip 1, that is, the side of the −y direction from the region occupied by the radiation element 3, the radiation directivity can be reinforced toward the side of the radiation element 3 when viewed from the semiconductor chip 1, that is, in the +y direction when the conductive plate 9 operates as a reflector.

(3) A tenth embodiment below relates to the application of a wireless device of any embodiment described above.

Tenth Embodiment

The respective wireless devices according to the first to ninth embodiments have been described and any of the described wireless devices can be mounted on various wireless apparatuses.

Examples of the wireless apparatus on which such a wireless device is mounted will be described below with reference to FIGS. 44 to 46.

A wireless apparatus according to the present embodiment is an apparatus to which a wireless function should be provided by mounting a "wireless device" according to any of the embodiments thereon. The wireless apparatus is not specifically limited and any apparatus may be used. For example, whether the apparatus has a GUI or not, the size or thickness of the apparatus, whether the apparatus is portable or not, whether a dedicated reader/writer is needed for the apparatus, and what kind of function the apparatus has are not limited. For example, the apparatus may be an apparatus that transmits and receives data such as characters, voice, images, or video. Also, for example, the apparatus may be a PC or a portable information terminal, or a card.

First, an example of the wireless apparatus on which the above "wireless device" will be described with reference to FIG. 44.

Figure 44:
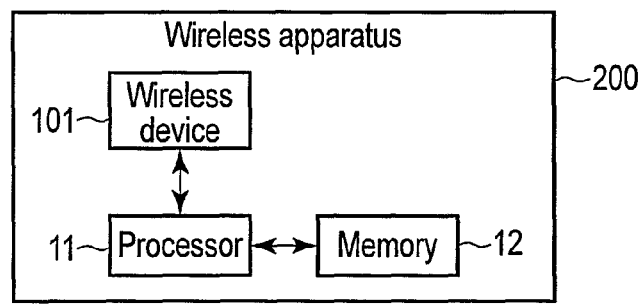
FIG. 44 is an exemplary block diagram of a wireless apparatus according to a tenth embodiment.

As illustrated in FIG. 44, a wireless apparatus 200 includes a wireless device 101, a processor 11, and a memory 12. The wireless apparatus 200 uses the wireless device 101 to perform wireless communication with the outside. Here, the description focuses on matter related to the wireless device 101.

For example, the wireless device 101 performs transmission/reception (wireless communication) of data to/from the outside. The wireless device of any of the first to ninth embodiments may be used as the wireless device 101.

The processor 11 performs, for example, data processing related to transmission/reception (wireless communication) by the wireless device 101. For example, the processor 11 processes data (received data) received from the wireless device 101 or data (transmission data) supplied to the wireless device 101.

The memory 12 stores, for example, data related to the above data processing. For example, the memory 12 receives data from the processor 11 to store the data (the processor 11 writes the data into the memory 12 when necessary). Also, for example, the memory 12 stores data to be transmitted and supplies the data to the processor 11 (the processor 11 reads the data from the memory 12 when necessary).

The wireless apparatus 200 may include any one or a plurality of elements other than the elements shown in FIG. 44.

Next, other examples of the wireless apparatus on which the above "wireless device" is mounted will be described with reference to FIG. 45.

Here, the examples of the wireless apparatus are a notebook PC 13 and a portable terminal 14. The notebook PC 13 and the portable terminal 14 each have the wireless device 101 internally or externally mounted thereon to perform data communication via the wireless device 101 using, for example, a frequency in the millimeter wave band.

The wireless device of any of the first to ninth embodiments may be used as the wireless device 101. The wireless device 101 to be mounted on the notebook PC 13 and the wireless device 101 to be mounted on the portable terminal 14 may be wireless devices according to the same embodiment or instead, wireless devices according to the different embodiments.

The wireless device 101 mounted on the notebook PC 13 and the wireless device 101 mounted on the portable terminal 14 can efficiently exchange data by being arranged in such a way that directions in which the directivity of each radiation element 3 is strong are opposite to each other.

In the example in FIG. 45, the notebook PC 13 and the portable terminal 14 are illustrated, but the present embodiment is not limited to such examples and the above wireless device may be mounted on various apparatuses, for example, a television, digital camera, memory card or the like.

Next, still another example of the wireless apparatus on which the above "wireless device" is mounted will be described with reference to FIG. 46.

Here, an example in which the above "wireless device" is mounted on a memory card will be described.

As shown in FIG. 46, a memory card 15 includes the wireless device 101 and a memory card body 16. The memory card 15 uses the wireless device 101 to perform wireless communication with the outside. In FIG. 46, other elements (for example, a memory) in the memory card 15 are omitted.

The wireless device of any of the first to ninth embodiments may be used as the wireless device 101.

The memory card 15 can perform wireless communication with various apparatuses, for example, a notebook PC, portable terminal, digital camera or the like via the wireless device 101.

The memory card is not specifically limited and may be any kind of card. In addition, the wireless device 101 can be mounted on various cards other than the memory card.

According to the tenth embodiment, as described above, data can efficiently be transmitted/received by mounting a wireless device on a wireless apparatus that wirelessly performs data communication like, for example, a notebook PC or portable terminal.

According to each embodiment, as described above, the radiation directivity of an antenna can easily be oriented in a direction perpendicular to the package surface or a direction parallel to the package surface.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A wireless device comprising:
a semiconductor chip including a wireless circuit;
a substrate having a plurality of terminals arranged on a first surface thereof and the semiconductor chip arranged on a second surface thereof that is different from the first surface;
an antenna including a radiation element and electrically connected to the semiconductor chip; and
a sealing material that seals the semiconductor chip and the antenna,
wherein a distance between a first wall of the sealing material substantially parallel to the second surface of the substrate and the radiation element is equal to or more than a distance between a second wall of the sealing material substantially perpendicular to the second surface of the substrate and the radiation element.

2. The device according to claim 1, wherein the radiation element is formed on the substrate in a position between the second wall of the sealing material and the semiconductor chip.

3. The device according to claim 1, wherein the semiconductor chip is arranged by being shifted toward a side of the radiation element when viewed from the semiconductor chip.

4. The device according to claim 1, wherein the distance between the second wall of the sealing material and the radiation element is less than approximately half a wavelength at an operating frequency.

5. The device according to claim 1, wherein a distance between the semiconductor chip and the radiation element is less than approximately ¾ wavelength at an operating frequency.

6. The device according to claim 1, wherein the distance between the first wall of the sealing material and the semiconductor chip is less than approximately ¼ wavelength at operating frequency.

7. The device according to claim 1,
wherein the wireless device is mounted on a mounting board having a conductive plate, and
the conductive plate includes at least a first region occupied by the terminals when viewed from a direction perpendicular to the second surface of the substrate.

8. The device according to claim 7, wherein the conductive plate further includes at least a second region occupied by the radiation element when viewed from the direction perpendicular to the second surface of the substrate.

9. A wireless apparatus that performs wireless communication with an outside comprising:
the wireless device according to claim 1 to perform the wireless communication with the outside;
a processor that performs data processing related to the wireless communication by the wireless device; and
a memory that stores data related to the data processing.

10. A memory card that performs wireless communication with an outside comprising:
the wireless device according to claim 1 to perform the wireless communication with the outside.

11. A wireless device comprising:
a semiconductor chip including a wireless circuit;
a substrate having a plurality of terminals arranged on a first surface thereof and the semiconductor chip arranged on a second surface thereof that is different from the first surface;
an antenna including a radiation element and electrically connected to the semiconductor chip; and
a sealing material that seals the semiconductor chip and the antenna,
wherein a distance between a second wall of the sealing material substantially perpendicular to the second surface of the substrate and the radiation element is more than a distance between a first wall of the sealing material substantially parallel to the second surface of the substrate and the radiation element and the distance between the second wall of the sealing material substantially perpendicular to the second surface of the substrate and the radiation element is equal to or more than approximately half a wavelength at an operating frequency.

12. The device according to claim 11, wherein the radiation element is formed on the substrate in a position between the second wall of the sealing material and the semiconductor chip.

13. The device according to claim 12, wherein the radiation element is arranged on an inner side from the terminals arranged on an outermost circumference of the terminals when viewed from a direction perpendicular to the second surface of the substrate.

14. The device according to claim 11, wherein the semiconductor chip is arranged by being shifted toward a side of the semiconductor chip when viewed from the radiation element.

15. The device according to claim 11, wherein a distance between the semiconductor chip and the radiation element is less than approximately half a wavelength at an operating frequency.

16. The device according to claim 11, wherein the distance between the first wall of the sealing material and the semiconductor chip is less than approximately ¼ wavelength at an operating frequency.

17. The device according to claim 11, wherein the wireless device is mounted on a mounting board having a conductive plate, and the conductive plate is arranged on a side of the semiconductor chip from a region occupied by the radiation element when viewed from a direction perpendicular to the second surface of the substrate.

18. A wireless apparatus that performs wireless communication with an outside comprising:

the wireless device according to claim 11 to perform the wireless communication with the outside;

a processor that performs data processing related to the wireless communication by the wireless device; and a memory that stores data related to the data processing.

19. A memory card that performs wireless communication with an outside comprising:

the wireless device according to claim 11 to perform the wireless communication with the outside.

\* \* \* \* \*